US008987728B2

(12) United States Patent
Honda et al.

(10) Patent No.: US 8,987,728 B2
(45) Date of Patent: Mar. 24, 2015

(54) SEMICONDUCTOR DEVICE AND METHOD OF MANUFACTURING SEMICONDUCTOR DEVICE

(75) Inventors: Tatsuya Honda, Tochigi (JP); Takatsugu Omata, Isehara (JP); Yusuke Nonaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 213 days.

(21) Appl. No.: 13/420,987

(22) Filed: Mar. 15, 2012

(65) Prior Publication Data

US 2012/0241734 A1    Sep. 27, 2012

(30) Foreign Application Priority Data

Mar. 25, 2011    (JP) .................. 2011-067866

(51) Int. Cl.
*H01L 29/786* (2006.01)
*H01L 21/36* (2006.01)
*H01L 29/423* (2006.01)
*H01L 29/66* (2006.01)

(52) U.S. Cl.
CPC ...... *H01L 29/7869* (2013.01); *H01L 29/42384* (2013.01); *H01L 29/66742* (2013.01); *H01L 29/78603* (2013.01)
USPC ........................................... 257/43; 438/104

(58) Field of Classification Search
USPC .................. 257/43; 438/85, 86, 104
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 5,940,705 A | 8/1999 | Lee et al. |
| 6,018,195 A | 1/2000 | Takebuchi |

(Continued)

FOREIGN PATENT DOCUMENTS

| EP | 1737044 A | 12/2006 |
| EP | 2226847 A | 9/2010 |

(Continued)

OTHER PUBLICATIONS

Okamura K et al., "Carrier transport in nanocrystalline field-effect transistors: impact of interface roughness and geometrical carrier trap.", Appl. Phys. Lett., 2010, vol. 97, No. 15, pp. 153114-1-153114-3.*

(Continued)

*Primary Examiner* — Daniel Shook
(74) *Attorney, Agent, or Firm* — Eric J. Robinson; Robinson Intellectual Property Law Office, P.C.

(57) ABSTRACT

An object is to provide a highly reliable semiconductor device having stable electric characteristics by using an oxide semiconductor film having stable electric characteristics. Another object is to provide a semiconductor device having higher mobility by using an oxide semiconductor film having high crystallinity. A crystalline oxide semiconductor film is formed over and in contact with an insulating film whose surface roughness is reduced, whereby the oxide semiconductor film can have stable electric characteristics. Accordingly, the highly reliable semiconductor device having stable electric characteristics can be provided. Further, the semiconductor device having higher mobility can be provided.

20 Claims, 16 Drawing Sheets

(56) References Cited

U.S. PATENT DOCUMENTS

| | | |
|---|---|---|
| 6,294,274 B1 | 9/2001 | Kawazoe et al. |
| 6,515,511 B2 | 2/2003 | Sugibayashi et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,491,575 B2 * | 2/2009 | Wu et al. ............ 438/104 |
| 7,501,293 B2 | 3/2009 | Ito et al. |
| 7,674,650 B2 | 3/2010 | Akimoto et al. |
| 7,678,625 B2 | 3/2010 | Lim et al. |
| 7,732,819 B2 | 6/2010 | Akimoto et al. |
| 8,207,025 B2 | 6/2012 | Suzawa et al. |
| 2001/0015450 A1 | 8/2001 | Sugibayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 * | 2/2005 | Hosono et al. ............ 117/2 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0160726 A1 | 7/2008 | Lim et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0127551 A1 * | 5/2009 | Imai ............... 257/43 |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0044700 A1 * | 2/2010 | Kim et al. ............ 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0068335 A1 * | 3/2011 | Yamazaki et al. ............ 257/43 |
| 2011/0114943 A1 * | 5/2011 | Yamazaki et al. ............ 257/43 |
| 2011/0215317 A1 | 9/2011 | Yamazaki et al. |
| 2011/0215326 A1 | 9/2011 | Godo et al. |
| 2011/0220891 A1 | 9/2011 | Fujii et al. |
| 2012/0052606 A1 * | 3/2012 | Yamazaki ............ 438/23 |
| 2012/0074407 A1 | 3/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-233789 A | 8/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2011-187945 A | 9/2011 |
| WO | WO-2004/114391 | 12/2004 |

OTHER PUBLICATIONS

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; 13: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A. (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Okamura.K et al., "Carrier transport in nanocrystalline field-effect transistors: Impact of interface roughness and geometrical carrier trap,", Appl. Phys. Lett. (Applied Physics Letters) , 2010, vol. 97, No. 15, pp. 153114-1-153114-3.

European Search Report (Application No. 12160463.1) Dated Jul. 5, 2012.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

\* cited by examiner

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device formed using an oxide semiconductor film and a method of manufacturing the semiconductor device.

In this specification, a semiconductor device means all types of devices which can function by utilizing semiconductor characteristics, and an electro-optical device, a semiconductor circuit, and an electronic device are all semiconductor devices.

2. Description of the Related Art

In recent years, a technique by which a semiconductor device typified by a transistor is manufactured using a semiconductor thin film formed over a substrate having an insulating surface has been attracting attention. Such a semiconductor device is applied to a wide range of electronic devices such as an integrated circuit (IC) or an image display device (display device). As a material of a semiconductor thin film that can be applied to such a semiconductor device typified by a transistor, a silicon-based semiconductor material is widely known.

Attention has also been drawn to a technique by which a transistor is manufactured using an amorphous oxide semiconductor material instead of a silicon-based semiconductor material and is applied to an electronic device or the like. For example, a technique for manufacturing a transistor whose active layer is formed using an amorphous oxide semiconductor material containing indium (In), gallium (Ga), and zinc (Zn) and having an electron carrier concentration lower than $10^{18}/cm^3$ is disclosed (see Patent Document 1).

REFERENCE

Patent Document

[Patent Document 1] Japanese Published Patent Application No. 2006-165529

SUMMARY OF THE INVENTION

However, in a film of an amorphous oxide semiconductor, a defect such as an oxygen vacancy or a dangling bond is easily caused. Because of such a defect, the electric conductivity or carrier density of the amorphous oxide semiconductor film is easily changed. Furthermore, such a defect causes a significant decrease in carrier mobility. Therefore, change or variation in the electric characteristics of a transistor formed using the amorphous oxide semiconductor film is remarkable, which results in low reliability of the semiconductor device.

Moreover, since the amorphous oxide semiconductor film has no crystallinity or low crystallinity, the mobility of the transistor formed using the amorphous oxide semiconductor film is low.

In view of the above problems, an object is to provide a highly reliable semiconductor device having stable electric characteristics by using an oxide semiconductor film having stable electric characteristics. Another object is to provide a semiconductor device having higher mobility by using an oxide semiconductor film having high crystallinity.

A crystalline oxide semiconductor film is formed over and in contact with an insulating film whose surface roughness is reduced, whereby the oxide semiconductor film can have high crystallinity and stable electric characteristics. Specifically, the following structure can be employed for example.

One embodiment of the invention disclosed herein is a semiconductor device including a crystalline oxide semiconductor film provided over and in contact with an insulating film. In the semiconductor device, the average surface roughness of a surface of the insulating film is greater than or equal to 0.1 nm and less than 0.5 nm, and the crystalline oxide semiconductor film includes a crystal whose c-axis is substantially perpendicular to the surface of the insulating film.

In the above embodiment, the insulating film preferably contains oxygen. The insulating film is preferably a silicon oxide film or a silicon oxynitride film. The insulating film is preferably a silicon oxide film formed by thermally oxidizing a surface of a silicon substrate.

Another embodiment of the invention disclosed herein is a semiconductor device including a first insulating film, a crystalline oxide semiconductor film provided over and in contact with the first insulating film, a source electrode and a drain electrode that are provided in contact with the oxide semiconductor film, a second insulating film provided over the oxide semiconductor film, and a gate electrode provided over the second insulating film. In the semiconductor device, the average surface roughness of a surface of the first insulating film is greater than or equal to 0.1 nm and less than 0.5 nm, and the crystalline oxide semiconductor film includes a crystal whose c-axis is substantially perpendicular to the surface of the first insulating film.

In the above embodiment, the first insulating film preferably contains oxygen. The first insulating film is preferably a silicon oxide film or a silicon oxynitride film. The first insulating film is preferably a silicon oxide film formed by thermally oxidizing a surface of a silicon substrate.

Another embodiment of the invention disclosed herein is a method of manufacturing a semiconductor device, including the steps of forming an insulating film having a surface with an average surface roughness greater than or equal to 0.1 nm and less than 0.5 nm, and forming an oxide semiconductor film over the insulating film while heating, so that a crystal whose c-axis is substantially perpendicular to the surface of the insulating film is formed in the oxide semiconductor film.

In the above embodiment, it is preferable that the insulating film be formed in such a manner that a silicon oxide film or a silicon oxynitride film is formed, and CMP treatment is performed on a surface of the silicon oxide film or the silicon oxynitride film. It is preferable that the insulating film be formed in such a manner that a silicon oxide film is formed by thermally oxidizing a surface of a silicon substrate. It is preferable that the oxide semiconductor film be formed in an oxygen atmosphere. It is preferable that heat treatment be performed on the oxide semiconductor film after the oxide semiconductor film is formed.

In this specification and the like, "a plane A is substantially parallel to a plane B" means "an angle between a normal of the plane A and a normal of the plane B is greater than or equal to 0° and less than or equal to 20°". In addition, in this specification and the like, "a line C is substantially perpendicular to the plane B" means "an angle between the line C and the normal of the plane B is greater than or equal to 0° and less than or equal to 20°".

In this specification and the like, average surface roughness ($R_a$) is obtained by three-dimension expansion of center line average roughness ($R_a$) which is defined by JISB0601:2001 (ISO 4287:1997) so that $R_a$ can be applied to a measurement surface, and is an average value of the absolute values of deviations from a reference surface to a specific surface.

Here, the center line average roughness ($R_a$) is shown by the following formula (1) assuming that a portion having a measurement length L is picked up from a roughness curve in the direction of the center of the roughness curve, the direction of a center line of the roughness curve of the picked portion is represented by an X-axis, the direction of longitudinal magnification (direction perpendicular to the X-axis) is represented by a Y-axis, and the roughness curve is expressed as Y=F(X).

[FORMULA 1]

$$R_a = \frac{1}{L}\int_0^L |F(X)|\, dX \quad (1)$$

When the measurement surface which is a surface represented by measurement data is expressed as Z=F(X,Y), the average surface roughness ($R_a$) is an average value of the absolute values of deviations from the reference surface to the specific surface and is shown by the following formula (2).

[FORMULA 2]

$$R_a = \frac{1}{S_0}\int_{Y_1}^{Y_2}\int_{X_1}^{X_2} |F(X,Y) - Z_0|\, dX\, dY \quad (2)$$

Here, the specific surface is a surface which is a target of roughness measurement, and is a rectangular region which is surrounded by four points represented by the coordinates $(X_1,Y_1)$, $(X_1,Y_2)$, $(X_2,Y_1)$, and $(X_2,Y_2)$. $S_0$ represents the area of the specific surface when the specific surface is flat ideally.

In addition, the reference surface is a surface parallel to an X-Y plane at the average height of the specific surface. That is, when the average value of the height of the specific surface is expressed as $Z_0$, the height of the reference surface is also expressed as $Z_0$.

A crystalline oxide semiconductor film is formed over and in contact with an insulating film whose surface roughness is reduced, whereby the oxide semiconductor film can have low defect density and stable electric characteristics. By using such an oxide semiconductor film for a semiconductor device, a highly reliable semiconductor device having stable electric characteristics can be provided. Moreover, an oxide semiconductor film having high crystallinity can be formed; therefore, by using the oxide semiconductor film, a semiconductor device having higher mobility can be provided.

DETAILED DESCRIPTION OF THE INVENTION

Figure 1A:
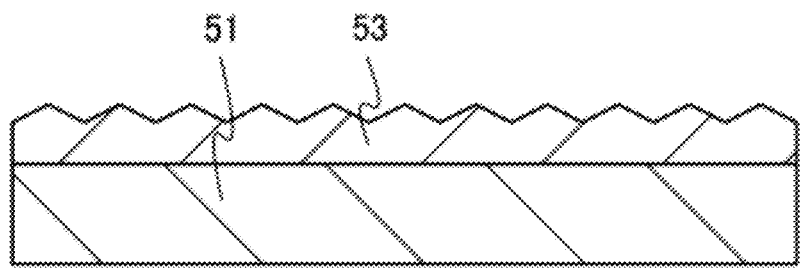
FIGS. 1A to 1C are cross-sectional views which illustrate a manufacturing process of a semiconductor device according to one embodiment of the present invention.

Embodiments and an example of the present invention will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments and example. Note that in structures of the present invention described below, the same portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Embodiment 1

In this embodiment, as one embodiment according to the present invention, an oxide semiconductor film that can be used for a semiconductor device and a method of forming the oxide semiconductor film will be described with reference to FIGS. 1A to 1C, FIGS. 2A to 2C, and FIGS. 3A and 3B.

Figure 1B:
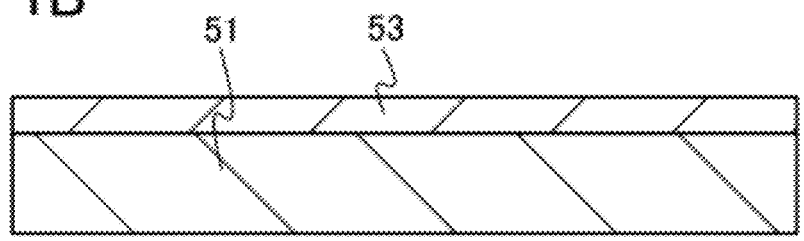
Figure 1C:
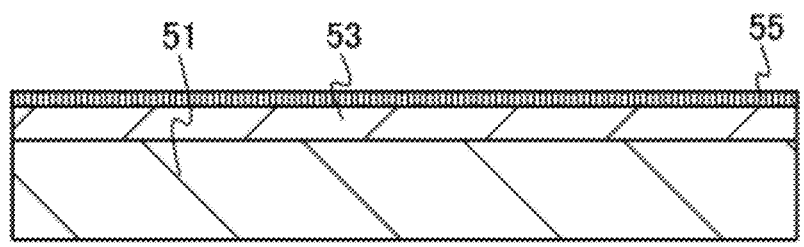

FIGS. 1A to 1C are cross-sectional views illustrating a formation process of an oxide semiconductor film that can be used for a semiconductor device. In this embodiment, as illustrated in FIG. 1C, a crystalline oxide semiconductor film 55 is formed over and in contact with an insulating film 53 which is provided over a substrate 51 and whose surface roughness is reduced.

The oxide semiconductor film 55 includes a crystalline region. The crystalline region includes a crystal whose a-b plane is substantially parallel to a surface of the insulating film 53 and whose c-axis is substantially perpendicular to the surface of the insulating film 53. That is, the oxide semiconductor film 55 includes a c-axis aligned crystal. The crystalline region in the oxide semiconductor film 55 has a structure in which atoms arranged in layers are stacked from the surface of the insulating film 53 toward a surface of the oxide semiconductor film 55, and in which atoms are arranged in a triangular, hexagonal, regular triangular, or regular hexagonal shape when seen from the c-axis direction. Since the oxide semiconductor film 55 includes the c-axis aligned crystalline region as described above, the oxide semiconductor film 55 can also be referred to as c-axis aligned crystalline oxide semiconductor (CAAC-OS) film.

The oxide semiconductor film 55 may include plural crystalline regions, and a-axis or b-axis directions of crystals in the plural crystalline regions may be different from each other. However, it is preferable that regions with different a-axis or b-axis directions be not in contact with each other in order to prevent formation of a grain boundary at an interface where the regions are in contact with each other. Therefore, the oxide semiconductor film 55 preferably includes an amorphous region which surrounds the crystalline region. That is, the oxide semiconductor film including the crystalline region is in a non-single-crystal state and not entirely in an amorphous state.

For the oxide semiconductor film 55, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide or a Sn—Zn—O-based metal oxide, or the like can be used. Above all, an In—Ga—Zn—O-based metal oxide has an energy gap that is as wide as 2 eV or more, preferably 2.5 eV or more, further preferably 3 eV or more in many cases; by manufacturing a transistor with the use of the In—Ga—Zn—O-based metal oxide, the transistor can have sufficiently high off-state resistance and sufficiently small off-state current.

As a typical example of the In—Ga—Zn—O-based metal oxide, one expressed as $InGaO_3(ZnO)_m$ (m>0) is given. Here, as examples of the In—Ga—Zn—O-based metal oxide, a metal oxide having a composition ratio of $In_2O_3:Ga_2O_3:ZnO=1:1:1$ [molar ratio], a metal oxide having a composition ratio of $In_2O_3:Ga_2O_3:ZnO=1:1:2$ [molar ratio], a metal oxide having a composition ratio of $In_2O_3:Ga_2O_3:ZnO=1:1:4$ [molar ratio], and a metal oxide having a composition ratio of $In_2O_3:Ga_2O_3:ZnO=2:1:8$ [molar ratio] can be given. It is preferable that m be not a natural number. Note that the above compositions are derived from crystal structures and are just examples.

As described above, the oxide semiconductor film 55 has a certain level or more of crystallinity, which is favorable as compared with an entirely amorphous oxide semiconductor film; therefore, oxygen vacancies, dangling bonds, hydrogen bonded to dangling bonds or the like, and impurities containing hydrogen such as water, a hydroxyl group, and hydroxide are reduced. These impurities function as sources for supplying carriers in the oxide semiconductor film, which might change the electric conductivity of the oxide semiconductor film. Therefore, the crystalline oxide semiconductor film in which these impurities are reduced has stable electric characteristics and is more electrically stable with respect to irradiation with visible light, ultraviolet light, and the like. By using the crystalline oxide semiconductor film 55 for a semiconductor device such as a transistor, a highly reliable semiconductor device having stable electric characteristics can be provided.

Note that hydrogen and impurities containing hydrogen such as water, a hydroxyl group, and hydride in the crystalline oxide semiconductor film are preferably reduced, and the concentration of hydrogen in the crystalline oxide semiconductor film is preferably lower than or equal to $1\times10^{19}$ atoms/$cm^3$. Hydrogen bonded to a dangling bond or the like, or an impurity containing hydrogen such as water, a hydroxyl group, or hydride might cause change in the electric conductivity of the oxide semiconductor film as described above. In addition, hydrogen contained in the oxide semiconductor film reacts with oxygen bonded to a metal atom to be water, and a defect is formed in a lattice from which oxygen is detached (or a portion from which oxygen is detached). Thus, a reduction of these impurities leads to stabilization of the electric characteristics of the crystalline oxide semiconductor film.

Further, impurities such as alkali metals in the crystalline oxide semiconductor film are preferably reduced. For example, in the crystalline oxide semiconductor film, the concentration of lithium is lower than or equal to $5\times10^{15}$ $cm^{-3}$, preferably lower than or equal to $1\times10^{15}$ $cm^{-3}$; the concentration of sodium is lower than or equal to $5\times10^{16}$ $cm^{-3}$, preferably lower than or equal to $1\times10^{16}$ $cm^{-3}$, further preferably lower than or equal to $1\times10^{15}$ $cm^{-3}$; and the concentration of potassium is lower than or equal to $5\times10^{15}$ $cm^{-3}$, preferably lower than or equal to $1\times10^{15}$ $cm^{-3}$.

An alkali metal and an alkaline earth metal are adverse impurities for the crystalline oxide semiconductor and are preferably contained as little as possible. In particular, when the oxide semiconductor film is used for a transistor, sodium that is one of alkali metals diffuses into an insulating film in contact with the crystalline oxide semiconductor film and becomes $Na^+$. In addition, sodium cuts a bond between a metal and oxygen or enters the bond in the crystalline oxide semiconductor film. As a result, transistor characteristics deteriorate (e.g., the transistor becomes normally-on (the threshold voltage shifts to a negative side) or the mobility is decreased). In addition, this also causes variation in the characteristics.

Such a problem is significant especially in the case where the concentration of hydrogen in the crystalline oxide semiconductor film is sufficiently low. Therefore, it is highly preferable to set the concentration of an alkali metal in the above range in the case where the concentration of hydrogen in the crystalline oxide semiconductor film is lower than or equal to $5\times10^{19}$ $cm^{-3}$, particularly lower than or equal to $5\times10^{18}$ $cm^{-3}$. Accordingly, it is preferable that impurities in the crystalline oxide semiconductor film be extremely reduced, the concentration of an alkali metal be lower than or equal to $5\times10^{16}$ atoms/$cm^{-3}$, and the concentration of hydrogen be lower than or equal to $5\times10^{19}$ atoms/$cm^{-3}$.

In addition, impurities such as boron, nitrogen, and phosphorus in the crystalline oxide semiconductor film are preferably reduced. For example, the concentration of boron in the crystalline oxide semiconductor film is preferably lower than or equal to $1\times10^{19}$ $cm^{-3}$, further preferably lower than or equal to $1\times10^{18}$ $cm^{-3}$. Alternatively, the concentration of nitrogen in the crystalline oxide semiconductor film is preferably lower than or equal to $1\times10^{19}$ $cm^{-3}$, further preferably lower than or equal to $1\times10^{18}$ cm$^{-3}$. Further alternatively, the concentration of phosphorus in the crystalline oxide semiconductor film is preferably lower than or equal to $1\times10^{19}$ cm$^{-3}$, further preferably lower than or equal to $1\times10^{18}$ cm$^{-3}$. Still further alternatively, the total concentration of boron, nitrogen, and phosphorus in the crystalline oxide semiconductor film is preferably lower than or equal to $5\times10^{19}$ cm$^{-3}$, further preferably lower than or equal to $5\times10^{18}$ cm$^{-3}$.

In the above manner, by reducing impurities in an oxide semiconductor film so that the oxide semiconductor film is highly purified, an i-type (intrinsic) or substantially i-type oxide semiconductor film can be formed. Thus, the off-state current characteristics of a transistor formed using the oxide semiconductor film can be quite excellent.

Furthermore, the surface of the insulating film 53 over which the oxide semiconductor film 55 is formed needs to have favorable planarity in order to improve the crystallinity of the oxide semiconductor film 55. For example, the average surface roughness ($R_a$) of the insulating film 53 is preferably greater than or equal to 0.1 nm and less than 0.5 nm. This is because a crystal included in the oxide semiconductor film 55 grows in the direction substantially perpendicular to the surface of the insulating film 53.

Figure 2A:
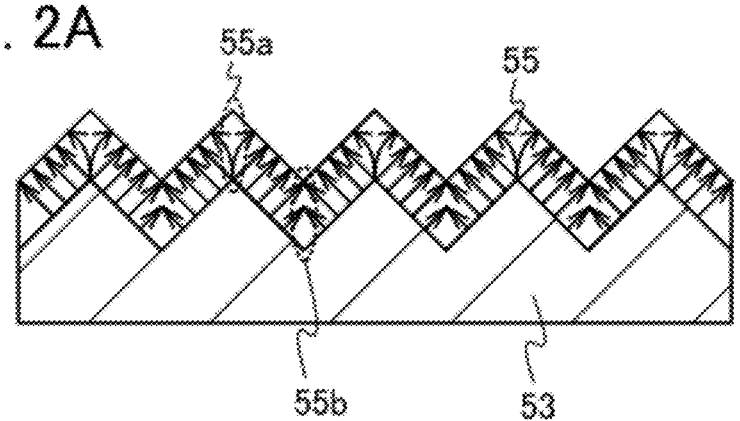
FIGS. 2A to 2C are cross-sectional views which illustrate a manufacturing process of a semiconductor device according to one embodiment of the present invention.
Figure 2B:
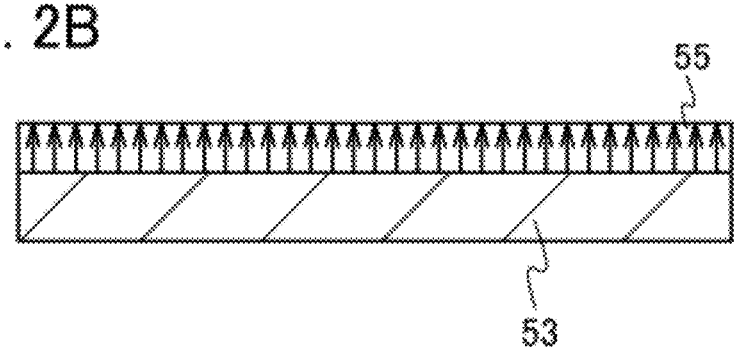
Figure 2C:
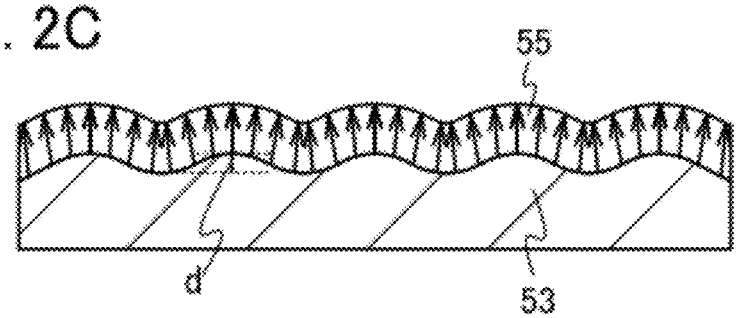

Here, how the crystallinity of the oxide semiconductor film 55 changes depending on the planarity of the insulating film 53 will be described with reference to FIGS. 2A to 2C. FIGS. 2A to 2C are enlarged views of the insulating film 53 and the oxide semiconductor film 55. Note that in FIGS. 2A to 2C, an arrow in the oxide semiconductor film 55 represents a direction in which a crystal included in the oxide semiconductor film 55 grows.

When the planarity of the surface of the insulating film 53 is low as illustrated in FIG. 2A, crystals grow substantially perpendicularly to inclined planes of projections of the surface of the insulating film 53. Consequently, the crystals are arranged in layers that are substantially parallel to the inclined planes of the projections of the surface of the insulating film 53. However, in a region 55a which corresponds to a top of a projection of the surface of the insulating film 53, crystals grow in different directions from each other. Therefore, the layered arrangement of crystals formed substantially in parallel to the inclined planes of the projection of the surface of the insulating film 53 is divided in the region 55a. Further, in a region 55b which corresponds to a bottom of a valley between projections of the surface of the insulating film 53, directions in which crystals around the region 55b grow intersect with each other. Therefore, the layered arrangement of crystals formed substantially in parallel to the inclined planes of the projections of the surface of the insulating film 53 is divided in the region 55b.

When the layered arrangement of crystals of the oxide semiconductor film is divided in this manner, a crystal grain boundary is generated. A dangling bond exists at the crystal grain boundary and forms a defect level in the bandgap of the oxide semiconductor film. Such a dangling bond at a crystal grain boundary mainly serves to trap a carrier and causes a decrease in the carrier mobility of the oxide semiconductor film, so that the resistance thereof is increased. Further, when the dangling bond is bonded to a hydrogen atom or the like, a donor level is formed in the bandgap of the oxide semiconductor film. Such a hydrogen atom bonded to a dangling bond serves as a donor and causes a decrease in the resistance of the oxide semiconductor film. Consequently, use of the oxide semiconductor film for a semiconductor device such as a transistor leads to change in the electric conductivity of a portion corresponding to the region 55a or the region 55b and a decrease in the mobility of the semiconductor device.

In contrast, when the planarity of the surface of the insulating film 53 is sufficiently high as illustrated in FIG. 2B, portions corresponding to the region 55a and the region 55b in FIG. 2A are not formed; therefore, the continuous layered arrangement of crystals formed substantially in parallel to the surface of the insulating film 53 can be provided. The oxide semiconductor film 55 with such a structure is provided in a semiconductor device such as a transistor, whereby the electrical stability of the semiconductor device can be obtained and a decrease in the mobility thereof can be suppressed.

Even when projections are formed on the surface of the insulating film 53 as illustrated in FIG. 2C, in the case where the projections are sufficiently gentle, the continuous layered arrangement of crystals formed substantially in parallel to inclined planes of the projections of the surface of the insulating film 53 is provided without being divided in portions corresponding to the region 55a and the region 55b in FIG. 2A. In order to form the insulating film 53 with such a structure, for example, the average surface roughness of the insulating film 53 is preferably less than 0.5 nm. In addition, at the surface of the insulating film 53, a difference d in height from a top of a projection to a bottom of a valley between the projection and a projection adjacent thereto is preferably less than or equal to 1 nm, further preferably less than or equal to 0.3 nm as illustrated in FIG. 2C.

As described above, by forming the crystalline oxide semiconductor film 55 over and in contact with the insulating film 53 whose surface roughness is reduced, a reduction in the density of grain boundary defects in the oxide semiconductor film 55 can be expected. Accordingly, the crystallinity of the oxide semiconductor film 55 can be further improved, and thus the electrical stability and mobility of a semiconductor device formed using the oxide semiconductor film 55 can be improved.

A formation process of the oxide semiconductor film 55 will be described below with reference to FIGS. 1A to 1C.

First, before the crystalline oxide semiconductor film 55 is formed, the insulating film 53 is formed over the substrate 51 as illustrated in FIG. 1A.

Although there is no particular limitation on a substrate that can be used as the substrate 51, it is necessary that the substrate have at least heat resistance high enough to withstand heat treatment performed later. For example, a glass substrate of aluminosilicate glass, aluminoborosilicate glass, barium borosilicate glass, or the like; a ceramic substrate; a quartz substrate; or a sapphire substrate can be used. Alternatively, a single crystal semiconductor substrate or a polycrystalline semiconductor substrate of silicon, silicon carbide, or the like; a compound semiconductor substrate of silicon germanium or the like; or the like may be used as the substrate 51. Further alternatively, a substrate obtained by forming an insulating layer over a surface of a semiconductor substrate of silicon or the like or a surface of a conductive substrate formed of a metal material can be used.

The insulating film 53 can be formed by a sputtering method, a CVD method, or the like, and the thickness thereof is greater than or equal to 50 nm, preferably greater than or equal to 200 nm and less than or equal to 500 nm.

Here, the insulating film 53 preferably contains oxygen. Since the oxide semiconductor film 55 is formed over and in contact with the insulating film 53 in a later step, by making the insulating film 53 contain oxygen, oxygen can be prevented from being extracted from the oxide semiconductor film 55 into the insulating film 53 by heat treatment or the like in a later step.

Further, the insulating film 53 is preferably formed using an oxide insulating film from which part of oxygen is released by heating. The oxide insulating film from which part of oxygen is released by heating is preferably an oxide insulating film which contains more oxygen than its stoichiometric composition. By using the oxide insulating film from which part of oxygen is released by heating as the insulating film 53, oxygen can be diffused into the oxide semiconductor film 55 by heat treatment in a later step. Typical examples of the oxide insulating film from which part of oxygen is released by heating include films of silicon oxide, silicon oxynitride, aluminum oxide, aluminum oxynitride, gallium oxide, hafnium oxide, and yttrium oxide. Such an oxide insulating film is used to diffuse oxygen, whereby oxygen vacancies in the oxide semiconductor film 55 formed later and at an interface between the insulating film 53 and the oxide semiconductor film 55 can be reduced.

In addition, the insulating film 53 does not necessarily contain oxygen, and a nitride insulating film may be formed using silicon nitride, aluminum nitride, or the like. The insulating film 53 may have a stacked-layer structure including the oxide insulating film and the nitride insulating film; in that case, the oxide insulating film is preferably provided over the nitride insulating film. By using the nitride insulating film as the insulating film 53, entry of an impurity such as an alkali metal into the oxide semiconductor film 55 can be prevented when a glass substrate containing an impurity such as an alkali metal is used as the substrate 51. Since alkali metals such as lithium, sodium, and potassium are adverse impurities for the oxide semiconductor, the content of such an alkali metal in the oxide semiconductor film is preferably low. The nitride insulating film can be formed by a CVD method, a sputtering method, or the like.

In this embodiment, a silicon oxide film formed by a sputtering method to a thickness of 300 nm is used as the insulating film 53.

Next, as illustrated in FIG. 1B, the insulating film 53 is planarized so that the surface roughness is reduced; the average surface roughness of the insulating film 53 is preferably greater than or equal to 0.1 nm and less than 0.5 nm. The insulating film 53 is preferably planarized by chemical mechanical polishing (CMP) treatment. Here, the CMP treatment is a method of planarizing a surface of an object to be processed with a combination of chemical and mechanical actions, using the surface as a reference. In general, the CMP treatment is a method in which a polishing cloth is attached to a polishing stage, the polishing stage and the object to be processed are each rotated or swung while a slurry (abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

The CMP treatment may be performed once or plural times. When the CMP treatment is performed plural times, first polishing is preferably performed with a high polishing rate followed by final polishing with a low polishing rate. By performing polishing steps with different polishing rates in combination, the planarity of the surface of the insulating film 53 can be further improved.

As treatment for planarizing the insulating film 53, dry etching treatment or the like can be performed instead of the CMP treatment. As an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate. For example, a dry etching method such as a reactive ion etching (RIE) method, an inductively coupled plasma (ICP) etching method, an electron cyclotron resonance (ECR) etching method, a parallel plate (capacitively coupled plasma) etching method, a magnetron plasma etching method, a dual-frequency plasma etching method, or a helicon wave plasma etching method can be used. In particular, when the insulating film 53 includes an inorganic insulating material containing a large amount of nitrogen, such as silicon nitride or silicon nitride oxide, it might be difficult to remove the inorganic insulating material containing a large amount of nitrogen only by the CMP treatment; therefore, CMP treatment and dry etching or the like are preferably performed in combination.

As treatment for planarizing the insulating film 53, plasma treatment or the like can also be performed instead of the CMP treatment. The plasma treatment is performed in such a manner that an inert gas such as an argon gas is introduced into a vacuum chamber and an electric field is applied so that a surface to be processed serves as a cathode. The plasma treatment has a principle similar to that of a plasma dry etching method, and is a simpler method because treatment in a general sputtering deposition chamber is possible by using an inert gas. That is, the plasma treatment is treatment in which the surface to be processed is irradiated with ions of an inert gas and minute unevenness of the surface is reduced by a sputtering effect. Therefore, the plasma treatment is also referred to as "reverse sputtering" in this specification.

In the reverse sputtering, electrons and argon cations are present in plasma and the argon cations are accelerated in a cathode direction. The surface to be processed is sputtered by the accelerated argon cations. At this time, a projection of the surface to be processed is preferentially sputtered. Particles ejected from the surface to be processed are attached to another place of the surface to be processed. At this time, the particles are preferentially attached to a depression of the surface to be processed. By thus reducing the projection and filling the depression, the planarity of the surface to be processed is improved.

Note that in the case where the insulating film 53 has sufficient planarity after being formed, the planarization of the insulating film 53 in FIG. 1B is not necessarily performed.

In this embodiment, the insulating film 53 is planarized by CMP treatment.

In this manner, the average surface roughness of the insulating film 53 is preferably set to be greater than or equal to 0.1 nm and less than 0.5 nm, whereby the crystallinity of the oxide semiconductor film 55 formed over the insulating film 53 can be further improved. Thus, the electrical stability and mobility of a semiconductor device formed using the oxide semiconductor film 55 can be improved.

Note that before formation of the oxide semiconductor film, powdery substances (also referred to as particle or dust) attached on the surface of the insulating film 53 are preferably removed by reverse sputtering in which an argon gas is introduced and plasma is generated. The reverse sputtering treatment can also serve as the above planarization treatment. Note that instead of argon, a gas of nitrogen, helium, oxygen, or the like may be used.

Next, the oxide semiconductor film 55 is formed over and in contact with the insulating film 53 as illustrated in FIG. 1C. The oxide semiconductor film 55 can be formed by a sputtering method, a molecular beam epitaxy method, an atomic layer deposition method, a pulsed laser deposition method, or the like, while the substrate 51 is heated. The thickness of the oxide semiconductor film 55 is greater than or equal to 2 nm and less than or equal to 200 nm, preferably greater than or equal to 5 nm and less than or equal to 100 nm, further preferably greater than or equal to 5 nm and less than or equal to 30 nm.

The oxide semiconductor film 55 may be formed using a metal oxide material containing two or more kinds selected from In, Ga, Zn, and Sn. For example, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; or a Zn—O-based material may be used. Here, for example, an In—Ga—Zn—O-based material means oxide containing indium (In), gallium (Ga), and zinc (Zn), and there is no particular limitation on the composition ratio. Further, the In—Ga—Zn—O-based material may contain an element other than In, Ga, and Zn. In this case, the oxide semiconductor film preferably contains more oxygen than its stoichiometric composition. When the amount of oxygen exceeds that in the stoichiometric composition, generation of carriers which results from oxygen vacancies in the oxide semiconductor film can be suppressed.

The oxide semiconductor film 55 may be formed using a metal oxide material expressed as the chemical formula, $InMO_3(ZnO)_m$ (m>0). Here, M represents one or more metal elements selected from Zn, Ga, Al, Mn, and Co. For example, M can be Ga, Ga and Al, Ga and Mn, or Ga and Co.

In the case where the oxide semiconductor film 55 is formed by a sputtering method, as an example of a target, a metal oxide target containing In, Ga, and Zn at a composition ratio of $In_2O_3:Ga_2O_3:ZnO=1:1:1$ [molar ratio] can be used. Alternatively, a target having a composition ratio of $In_2O_3:Ga_2O_3:ZnO=1:1:2$ [molar ratio], a target having a composition ratio of $In_2O_3:Ga_2O_3:ZnO=1:1:4$ [molar ratio], or a target having a composition ratio of $In_2O_3:Ga_2O_3:ZnO=2:1:8$ [molar ratio] can be used.

In the case where an In—Zn—O-based material is used as the oxide semiconductor, a target having a composition ratio of In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), further preferably In:Zn=15:1 to 1.5:1 in an atomic ratio ($In_2O_3:ZnO=15:2$ to 3:4 in a molar ratio) is used. For example, in a target used for formation of an In—Zn—O-based oxide semiconductor which has an atomic ratio of In:Zn:O=X:Y:Z, the relation of $Z>1.5X+Y$ is satisfied.

In the formation of the oxide semiconductor film 55, the oxide semiconductor film 55 is preferably formed while the substrate 51 is heated. The temperature at which the substrate 51 is heated may be higher than or equal to 150° C. and lower than or equal to 450° C., preferably higher than or equal to 200° C. and lower than or equal to 350° C. By heating the substrate at a high temperature during the formation of the oxide semiconductor film 55, the crystallinity of the oxide semiconductor film 55 can be further improved. Thus, the electrical stability and mobility of a semiconductor device formed using the oxide semiconductor film 55 can be improved.

In the formation of the oxide semiconductor film 55 by a sputtering method, a rare gas (typically argon), oxygen, or a mixed gas of a rare gas and oxygen can used as appropriate as a sputtering gas. At this time, the flow rate of an oxygen gas is preferably higher than that of a rare gas, and an oxygen atmosphere is particularly preferable. By forming the oxide semiconductor film 55 in such an atmosphere, the crystallinity of the oxide semiconductor film 55 can be further improved. Thus, the mobility of a semiconductor device formed using the oxide semiconductor film 55 can be improved. It is preferable that a high-purity gas from which impurities such as hydrogen, water, a hydroxyl group, and hydride are removed be used as the sputtering gas.

In the formation of the oxide semiconductor film 55 by a sputtering method, the concentration of hydrogen contained in the oxide semiconductor film 55 is preferably reduced as much as possible. In order to reduce the hydrogen concentration, a high-purity gas from which impurities such as hydrogen, water, a hydroxyl group, and hydride are removed is preferably supplied into a treatment chamber of a sputtering apparatus as an atmosphere gas. Further, the treatment chamber may be evacuated with the use of a cryopump having high capability in evacuating water and a sputter ion pump having high capability in evacuating hydrogen in combination.

In the above method, the oxide semiconductor film 55 is formed in one film formation step; the oxide semiconductor film 55 may be formed through two film formation steps. A method of forming the oxide semiconductor film 55 through two film formation steps will be described below.

First, while the temperature of the substrate 51 is kept at a temperature higher than or equal to 200° C. and lower than or equal to 400° C., a first-layer oxide semiconductor film is formed over and in contact with the insulating film 53. Then, heat treatment is performed at a temperature higher than or equal to 550° C. and lower than the strain point of the substrate in an atmosphere of nitrogen, oxygen, a rare gas, or dry air. By the heat treatment, a crystalline region (including a plate-like crystal) is formed in a region including a surface of the first-layer oxide semiconductor film. Note that the thickness of the first-layer oxide semiconductor film is preferably greater than or equal to 1 nm and less than or equal to 10 nm. Next, a second-layer oxide semiconductor film is formed to be thicker than the first-layer oxide semiconductor film. After that, heat treatment is performed again at a temperature higher than or equal to 550° C. and lower than the strain point of the substrate, so that crystals grow upward using, as a seed of crystal growth, the first-layer oxide semiconductor film in which a crystalline region (including a plate-like crystal) is formed in the region including the surface. Thus, the second-layer oxide semiconductor film is entirely crystallized. Note that conditions of the formation of the first-layer oxide semiconductor film and the second-layer oxide semiconductor film may be similar to those of the oxide semiconductor film 55 described above.

It is preferable that heat treatment be performed on the oxide semiconductor film 55 after the oxide semiconductor film 55 is formed. The heat treatment is performed at a temperature higher than or equal to 250° C. and lower than or equal to 700° C. or lower than the strain point of the substrate, preferably higher than 450° C. and lower than or equal to 650° C. or lower than the strain point of the substrate.

The heat treatment can be performed in such a manner that, for example, an object to be processed is introduced into an electric furnace in which a resistance heating element or the like is used and heated at 650° C. for 1 hour in an oxygen atmosphere. During the heat treatment, the oxide semiconductor film 55 is not exposed to the air in order to prevent entry of water and hydrogen.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

By such heat treatment, excessive hydrogen (including water and a hydroxyl group) in the oxide semiconductor film 55 can be removed, the crystallinity of the oxide semiconductor film 55 can be improved, and dangling bonds therein can be reduced to reduce defect levels in the bandgap. It is also possible to remove excessive hydrogen (including water and a hydroxyl group) from the insulating film. By removing impurities by heat treatment in this manner, the i-type (intrinsic) or substantially i-type oxide semiconductor film 55 can be formed.

Moreover, when such heat treatment is performed in a state where the insulating film 53 contains oxygen, preferably in a state where the insulating film 53 contains more oxygen than its stoichiometric composition, oxygen can be supplied to the oxide semiconductor film 55. In the case where oxygen is supplied to the oxide semiconductor film 55 by heat treatment in this manner, the heat treatment is preferably performed in an oxygen atmosphere. By supplying oxygen to the oxide semiconductor film 55 by such heat treatment, oxygen vacancies in the oxide semiconductor film 55 can be reduced.

Note that such heat treatment may be performed once or plural times.

The oxide semiconductor film 55 formed by the above method has a certain level or more of crystallinity, which is favorable as compared with an entirely amorphous oxide semiconductor film; therefore, oxygen vacancies, dangling bonds, hydrogen bonded to dangling bonds or the like, and impurities containing hydrogen such as water, a hydroxyl group, and hydroxide are reduced. These impurities function as traps of carriers or sources for supplying carriers in the oxide semiconductor film, which might change the electric conductivity of the oxide semiconductor film. Therefore, the oxide semiconductor film which includes a crystalline region and in which these impurities are reduced has stable electric characteristics and is more electrically stable with respect to irradiation with visible light, ultraviolet light, and the like. By using the crystalline oxide semiconductor film 55 for a semiconductor device such as a transistor, a highly reliable semiconductor device having stable electric characteristics can be provided.

Moreover, by forming the crystalline oxide semiconductor film 55 over and in contact with the insulating film 53 whose surface roughness is reduced, the crystallinity of the oxide semiconductor film 55 can be further improved. Thus, the mobility of a semiconductor device formed using the oxide semiconductor film 55 can be improved.

In the formation process of the oxide semiconductor film 55 in FIGS. 1A to 1C, the CMP treatment is performed to planarize the surface of the insulating film 53; one embodiment of the invention disclosed herein is not necessarily limited to this. For example, the following process may be employed: a silicon wafer substrate is used as the substrate 51, a silicon oxide film having sufficient planarity is formed by thermally oxidizing a surface of the substrate, and the oxide semiconductor film 55 is formed over the silicon oxide film. The case where the oxide semiconductor film 55 is formed by the above method will be described below with reference to FIGS. 3A and 3B.

Figure 3A:
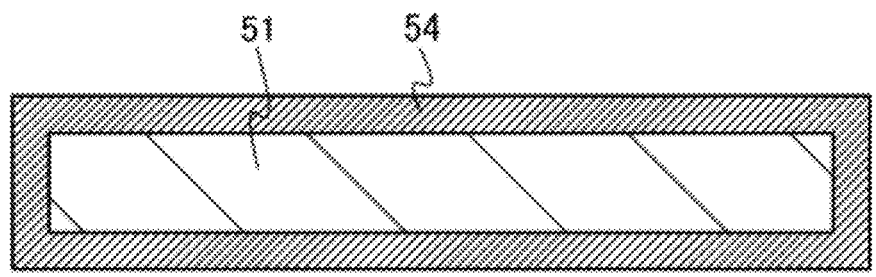
FIGS. 3A and 3B are cross-sectional views which illustrate a manufacturing process of a semiconductor device according to one embodiment of the present invention.

First, as illustrated in FIG. 3A, the surface of the substrate 51 is thermally oxidized, so that an insulating film 54 is formed on the surface of the substrate 51. As the thermal oxidation treatment, dry oxidation in a dry oxygen atmosphere, wet oxidation in an atmosphere containing water vapor, or heat treatment in an oxidizing atmosphere to which a halogen-containing gas is added may be performed. As the halogen-containing gas, one or plural kinds of gases selected from $HCl$, $HF$, $NF_3$, $HBr$, $Cl_2$, $ClF$, $BCl_3$, $F_2$, $Br_2$, and the like can be used.

For example, heat treatment is performed at a temperature higher than or equal to 700° C. and lower than or equal to 1100° C. in an atmosphere containing HCl at 0.5 vol. % to 10 vol. % (preferably 3 vol. %) with respect to oxygen. For example, heat treatment may be performed at approximately 950° C. The treatment time may be 0.1 hours to 6 hours, preferably 0.5 hours to 1 hour. The thickness of the oxide film formed can be 10 nm to 1100 nm (preferably 50 nm to 150 nm), for example, 100 nm.

The surface roughness of the insulating film 54 formed in this manner depends on the surface roughness of the substrate 51. Therefore, in order to set the average surface roughness of the insulating film 54 to be greater than or equal to 0.1 nm and less than 0.5 nm as in the case of the insulating film 53 in FIGS. 1A to 1C, it is preferable that the substrate 51 also have an average surface roughness greater than or equal to 0.1 nm and less than 0.5 nm. For formation of the insulating film 54 having such sufficient planarity, a substrate having sufficiently high planarity, such as a single crystal silicon substrate, is preferably used as the substrate 51.

Figure 3B:
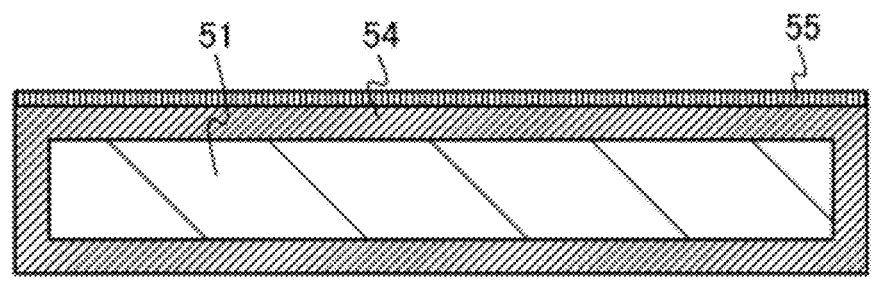

Then, the oxide semiconductor film 55 is formed over and in contact with the insulating film 54 having sufficiently high planarity as illustrated in FIG. 3B, whereby the crystallinity of the oxide semiconductor film 55 can be further improved. Thus, the mobility of a semiconductor device formed using the oxide semiconductor film 55 can be improved. The oxide semiconductor film 55 can be formed by a method similar to the method illustrated in FIG. 1C.

As described above, the crystalline oxide semiconductor film is formed over and in contact with the insulating film whose surface roughness is reduced, whereby the oxide semiconductor film can have stable electric characteristics. By using such an oxide semiconductor film for a semiconductor device, a highly reliable semiconductor device having stable electric characteristics can be provided. Moreover, an oxide semiconductor film having high crystallinity can be formed; therefore, by using the oxide semiconductor film, a semiconductor device having higher mobility can be provided.

The structures and the like described in this embodiment can be combined as appropriate with any of the structures, methods, and the like described in the other embodiments.

Embodiment 2

In this embodiment, as an example of a semiconductor device formed using the crystalline oxide semiconductor film described in the above embodiment, a transistor formed using the oxide semiconductor film and a method of manufacturing the transistor will be described with reference to FIGS. 4A to 4D and FIGS. 5A to 5C. FIGS. 4A to 4D are cross-sectional views illustrating a manufacturing process of a transistor 120 having a top-gate structure which is one embodiment of a structure of a semiconductor device.

Figure 4A:
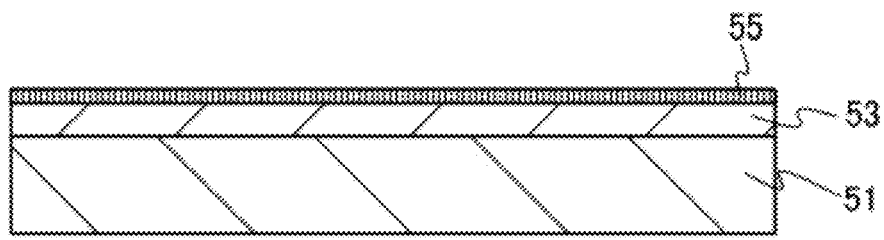
FIGS. 4A to 4D are cross-sectional views which illustrate a manufacturing process of a semiconductor device according to one embodiment of the present invention.
Figure 4B:
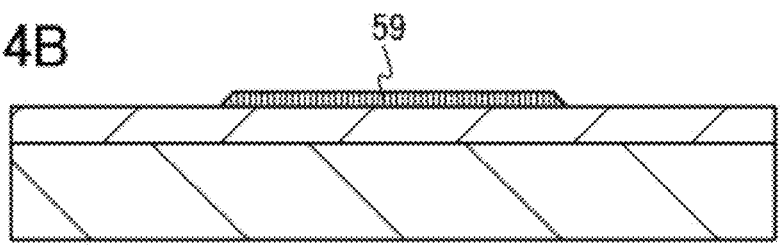

First, as illustrated in FIG. 4A, the oxide semiconductor film 55 is formed over and in contact with the insulating film 53 provided over the substrate 51, by the method described in the above embodiment. Then, the oxide semiconductor film 55 is selectively etched with the use of a mask, so that an oxide semiconductor film 59 is formed as illustrated in FIG. 4B. After that, the mask is removed.

The mask used in the etching of the oxide semiconductor film 55 can be formed as appropriate by a photolithography method, an inkjet method, a printing method, or the like. Wet etching or dry etching may be employed as appropriate for the etching of the oxide semiconductor film 55.

Figure 4C:
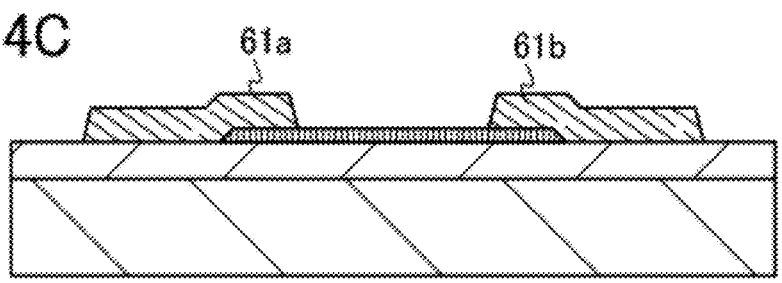

Next, as illustrated in FIG. 4C, a source electrode 61a and a drain electrode 61b which are in contact with the oxide semiconductor film 59 are formed.

The source electrode 61a and the drain electrode 61b can be formed using a metal element selected from aluminum, chromium, copper, tantalum, titanium, molybdenum, tungsten, manganese, and zirconium; an alloy containing any of these metal elements as a component; an alloy containing any of these metal elements in combination; or the like. Alternatively, an alloy film or a nitride film which contains aluminum and one or more metal elements selected from titanium, tantalum, tungsten, molybdenum, chromium, neodymium, and scandium may be used. The source electrode 61a and the drain electrode 61b may have a single-layer structure or a stacked-layer structure including two or more layers. For example, a single-layer structure of an aluminum film containing silicon, a two-layer structure in which a copper film is stacked over a Cu—Mg—Al alloy film, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, or a three-layer structure in which a titanium film, an aluminum film, and a titanium film are stacked in this order can be used.

The source electrode 61a and the drain electrode 61b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

After a conductive film is formed by a sputtering method, a CVD method, an evaporation method, or the like, a mask is formed over the conductive film and the conductive film is etched, and thereby the source electrode 61a and the drain electrode 61b are formed. The mask formed over the conductive film can be formed by a printing method, an inkjet method, or a photolithography method as appropriate. Alternatively, the source electrode 61a and the drain electrode 61b can be directly formed by a printing method or an inkjet method.

Here, the conductive film is formed over the oxide semiconductor film 59 and the insulating film 53 and then etched into a predetermined shape, so that the source electrode 61a and the drain electrode 61b which are in contact with an upper surface and side surfaces of the oxide semiconductor film are formed. At this time, in some cases, a region which is in the oxide semiconductor film 59 and overlaps with neither the source electrode 61a nor the drain electrode 61b is etched and a depression is formed in the oxide semiconductor film 59.

Alternatively, the oxide semiconductor film 59, the source electrode 61a, and the drain electrode 61b may be formed in such a manner that a conductive film is formed over the oxide semiconductor film 55, and the oxide semiconductor film 55 and the conductive film are etched using a multi-tone photomask. A concavo-convex shaped mask is formed, the oxide semiconductor film 55 and the conductive film are etched using the concavo-convex shaped mask, the concavo-convex shaped mask is divided by ashing, and the conductive film is selectively etched using the divided mask, whereby the oxide semiconductor film 59, the source electrode 61a, and the drain electrode 61b can be formed. With this process, the number of the photomasks and the number of steps in the photolithography process can be reduced.

Then, a gate insulating film 63 is formed over the oxide semiconductor film 59, the source electrode 61a, and the drain electrode 61b.

The gate insulating film 63 can be formed to have a single-layer structure or a stacked-layer structure with the use of any of silicon oxide, silicon oxynitride, silicon nitride, silicon nitride oxide, aluminum oxide, aluminum oxynitride, and gallium oxide. As in the case of the insulating film 53, the gate insulating film 63 preferably contains oxygen. Further, the gate insulating film 63 is preferably formed using an oxide insulating film from which part of oxygen is released by heating. The oxide insulating film from which part of oxygen is released by heating is preferably an oxide insulating film which contains more oxygen than its stoichiometric composition. The oxide insulating film containing oxygen can be formed using silicon oxide, silicon oxynitride, aluminum oxide, aluminum oxynitride, gallium oxide, or the like. By using the oxide insulating film from which part of oxygen is released by heating, oxygen can be diffused into the oxide semiconductor film 59 by heat treatment in a later step and the transistor 120 can have favorable characteristics.

When the gate insulating film 63 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be reduced. Further, a stacked-layer structure formed using a high-k material and one or more of silicon oxide, silicon oxynitride, silicon nitride, silicon nitride oxide, aluminum oxide, aluminum oxynitride, and gallium oxide can be employed. The thickness of the gate insulating film 63 is preferably greater than or equal to 1 nm and less than or equal to 300 nm, further preferably greater than or equal to 5 nm and less than or equal to 50 nm. When the thickness of the gate insulating film 63 is greater than or equal to 5 nm, gate leakage current can be reduced.

Before the gate insulating film 63 is formed, the surface of the oxide semiconductor film 59 may be exposed to plasma of an oxidizing gas such as oxygen, ozone, or dinitrogen monoxide so as to be oxidized, thereby reducing oxygen vacancies.

Next, a gate electrode 65 is formed over the gate insulating film 63 so as to overlap with the oxide semiconductor film 59.

The gate electrode 65 can be formed using a metal element selected from aluminum, chromium, copper, tantalum, titanium, molybdenum, tungsten, manganese, and zirconium; an alloy containing any of these metal elements as a component; an alloy containing any of these metal elements in combination; or the like. Alternatively, an alloy film or a nitride film which contains aluminum and one or more metal elements selected from titanium, tantalum, tungsten, molybdenum, chromium, neodymium, and scandium may be used. The gate electrode 65 may have a single-layer structure or a stacked-layer structure including two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, or a three-layer structure in which a titanium film, an aluminum film, and a titanium film are stacked in this order can be used.

The gate electrode 65 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. In addition, a compound conductor obtained by sputtering using an In—Ga—Zn—O-based metal oxide as a target in an atmosphere containing nitrogen may be used. It is also possible to employ a stacked-layer structure formed using the above light-transmitting conductive material and the above metal element.

Figure 4D:
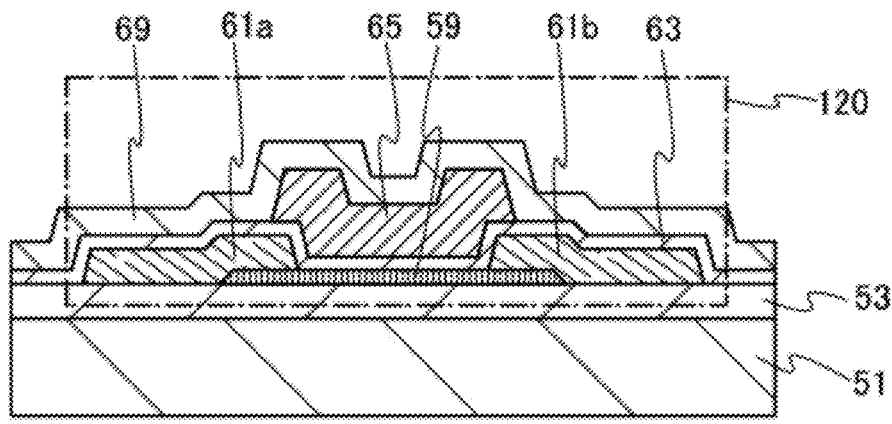

Further, an insulating film 69 may be formed as a protective film over the gate electrode 65 (see FIG. 4D). In addition, contact holes may be formed in the gate insulating film 63 and the insulating film 69, and then wirings may be formed to be connected to the source electrode 61*a* and the drain electrode 61*b*.

The insulating film 69 can be formed as appropriate with the use of an insulating film similar to the gate insulating film 63. When a silicon nitride film is formed as the insulating film 69 by a sputtering method, entry of moisture and an alkali metal from the outside can be prevented, and thus the amount of impurities contained in the oxide semiconductor film 59 can be reduced.

Note that after the gate insulating film 63 is formed or after the insulating film 69 is formed, heat treatment may be performed. This heat treatment enables release of hydrogen from the oxide semiconductor film 59 and diffusion of part of oxygen contained in the insulating film 53, the gate insulating film 63, or the insulating film 69 into the oxide semiconductor film 59, in the vicinity of an interface between the insulating film 53 and the oxide semiconductor film 59, and in the vicinity of an interface between the gate insulating film 63 and the oxide semiconductor film 59. In this step, oxygen vacancies in the oxide semiconductor film 59 can be reduced, and defects at the interface between the oxide semiconductor film 59 and the insulating film 53 or the interface between the oxide semiconductor film 59 and the gate insulating film 63 can be reduced. As a result, the oxide semiconductor film 59 with lower hydrogen concentration and less oxygen vacancies can be formed. By removing impurities by heat treatment in this manner, the i-type (intrinsic) or substantially i-type oxide semiconductor film 59 can be formed. Thus, the off-state current characteristics of the transistor 120 can be quite excellent.

Through the above process, the transistor 120 in which a channel region is formed in the crystalline oxide semiconductor film can be manufactured. As illustrated in FIG. 4D, the transistor 120 includes the insulating film 53 provided over the substrate 51, the oxide semiconductor film 59 provided over and in contact with the insulating film 53, the source electrode 61*a* and the drain electrode 61*b* which are provided in contact with the oxide semiconductor film 59, the gate insulating film 63 provided over the oxide semiconductor film 59, the gate electrode 65 provided over the gate insulating film 63 so as to overlap with the oxide semiconductor film 59, and the insulating film 69 provided over the gate electrode 65.

The crystalline oxide semiconductor film used for the transistor 120 has a certain level or more of crystallinity, which is favorable as compared with an entirely amorphous oxide semiconductor film; therefore, oxygen vacancies, dangling bonds, and impurities such as hydrogen bonded to dangling bonds or the like are reduced. Therefore, the crystalline oxide semiconductor film in which these are reduced has stable electric characteristics and is more electrically stable with respect to irradiation with visible light, ultraviolet light, and the like. By using such a crystalline oxide semiconductor film for a transistor, a highly reliable semiconductor device having stable electric characteristics can be provided.

In the transistor 120, the crystalline oxide semiconductor film 55 is formed over and in contact with the insulating film 53 whose surface roughness is reduced, whereby the crystallinity of the oxide semiconductor film 55 can be further improved. Thus, the mobility of a semiconductor device formed using the oxide semiconductor film 55 can be improved.

The semiconductor device according to this embodiment is not limited to the transistor 120 illustrated in FIGS. 4A to 4D. For example, a structure similar to that of a transistor 130 illustrated in FIG. 5A may be employed. The transistor 130 includes the insulating film 53 provided over the substrate 51, the source electrode 61*a* and the drain electrode 61*b* which are provided over the insulating film 53, the oxide semiconductor film 59 provided in contact with upper surfaces and side surfaces of the source electrode 61*a* and the drain electrode 61*b*, the gate insulating film 63 provided over the oxide semiconductor film 59, the gate electrode 65 provided over the gate insulating film 63 so as to overlap with the oxide semiconductor film 59, and the insulating film 69 provided over the gate electrode 65. That is, the transistor 130 is different from the transistor 120 in that the oxide semiconductor film 59 is provided in contact with the upper surfaces and the side surfaces of the source electrode 61*a* and the drain electrode 61*b*.

Figure 5A:
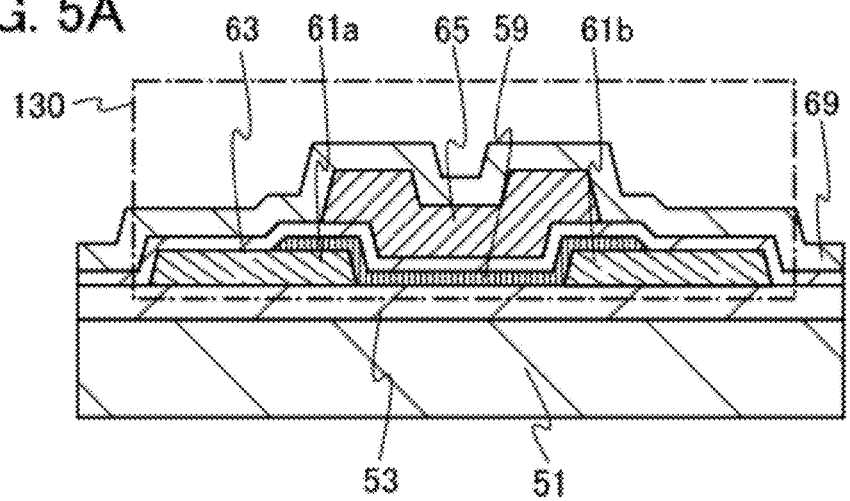
FIGS. 5A to 5C are each a cross-sectional view of a semiconductor device according to one embodiment of the present invention.
Figure 5B:
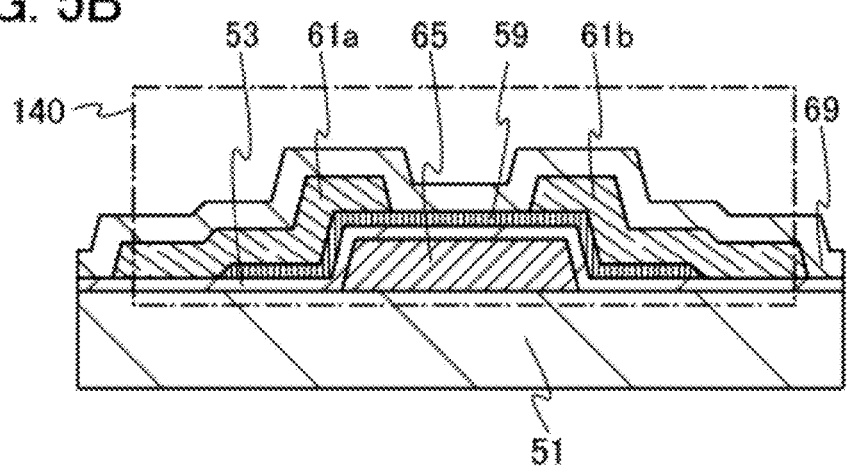

In addition, a structure similar to that of a transistor 140 illustrated in FIG. 5B may be employed. The transistor 140 includes the gate electrode 65 provided over the substrate 51, the insulating film 53 provided over the gate electrode 65, the oxide semiconductor film 59 provided over the insulating film 53, the source electrode 61*a* and the drain electrode 61*b* which are provided in contact with an upper surface and side surfaces of the oxide semiconductor film 59, and the insulating film 69 provided over the oxide semiconductor film 59. That is, the transistor 140 is different from the transistor 120 in that it has a bottom-gate structure in which the gate electrode 65 and the insulating film 53 functioning as a gate insulating film are provided below the oxide semiconductor film 59. Note that a base insulating film may be provided between the substrate 51 and the gate electrode 65.

Figure 5C:
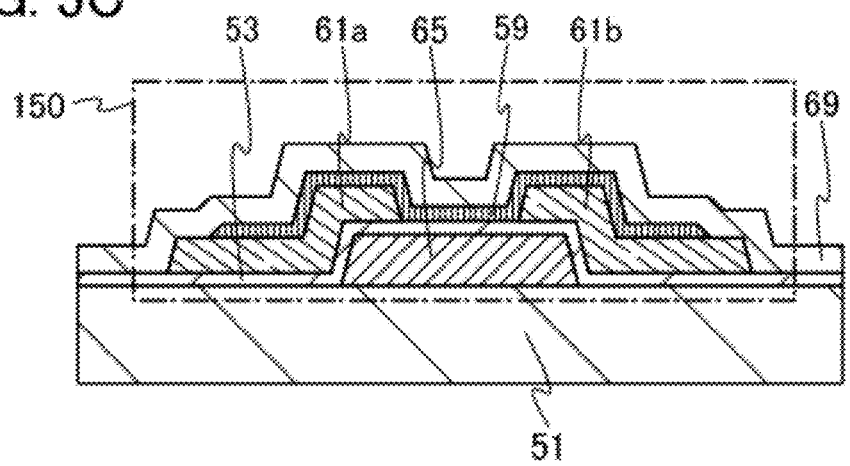

In addition, a structure similar to that of a transistor 150 illustrated in FIG. 5C may be employed. The transistor 150 includes the gate electrode 65 provided over the substrate 51, the insulating film 53 provided over the gate electrode 65, the source electrode 61*a* and the drain electrode 61*b* which are provided over the insulating film 53, the oxide semiconductor film 59 provided in contact with upper surfaces and side surfaces of the source electrode 61*a* and the drain electrode 61*b*, and the insulating film 69 provided over the oxide semiconductor film 59. That is, the transistor 150 is different from the transistor 130 in that it has a bottom-gate structure in which the gate electrode 65 and the insulating film 53 functioning as a gate insulating film are provided below the oxide semiconductor film 59. Note that a base insulating film may be provided between the substrate 51 and the gate electrode 65.

As described above, the crystalline oxide semiconductor film is formed over and in contact with the insulating film whose surface roughness is reduced, whereby the oxide semiconductor film can have stable electric characteristics. By using such an oxide semiconductor film for a semiconductor device, a highly reliable semiconductor device having stable electric characteristics can be provided. Moreover, an oxide semiconductor film having high crystallinity can be formed; therefore, by using the oxide semiconductor film, a semiconductor device having higher mobility can be provided.

The methods, structures, and the like described in this embodiment can be combined as appropriate with any of the methods, structures, and the like described in the other embodiments.

Embodiment 3

In this embodiment, as an example of a semiconductor device formed by the method of manufacturing a semiconductor device described in the above embodiment, a storage medium (memory element) will be described. In this embodiment, a transistor formed using an oxide semiconductor by the method of manufacturing a semiconductor device described in the above embodiment, and a transistor formed using a material other than an oxide semiconductor are formed over one substrate.

Figure 6A:
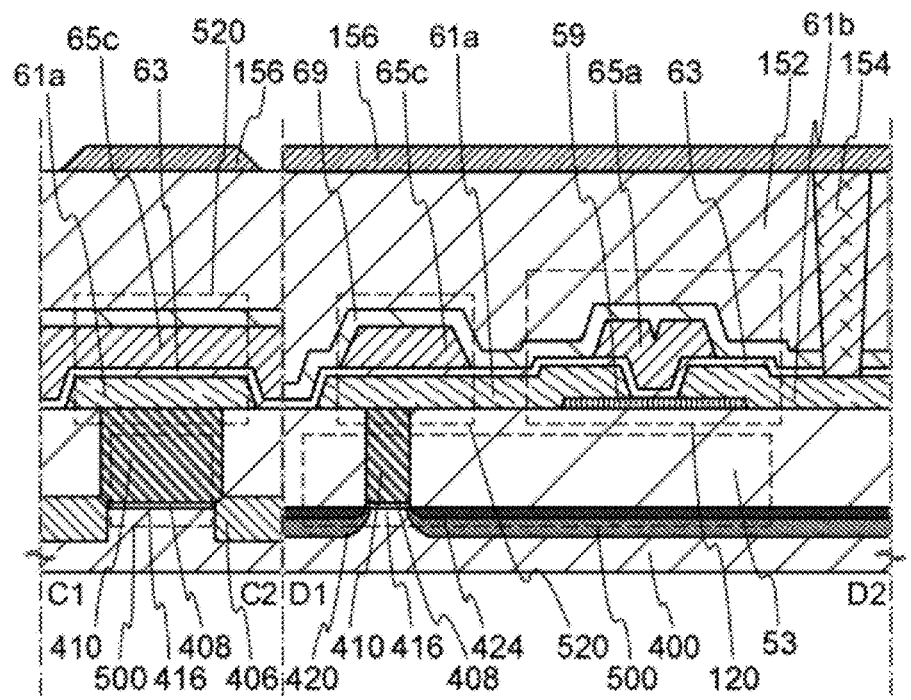
FIGS. 6A to 6C are a cross-sectional view, a plan view, and an equivalent circuit diagram of a semiconductor device according to one embodiment of the present invention.
Figure 6B:
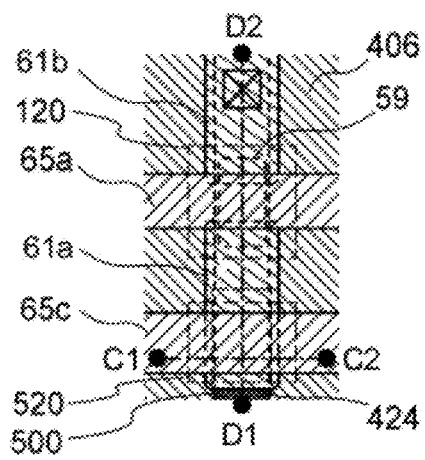
Figure 6C:
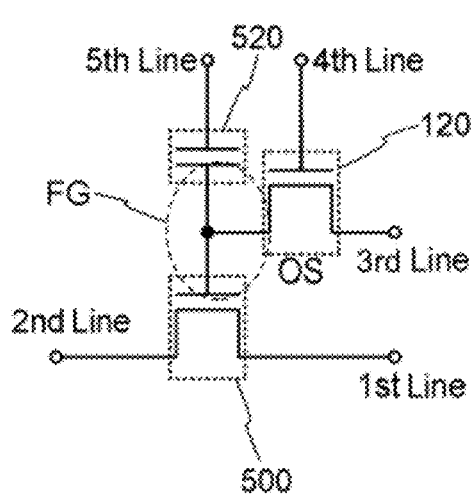

FIGS. 6A to 6C illustrate an example of a structure of a semiconductor device. FIG. 6A illustrates a cross section of the semiconductor device, and FIG. 6B illustrates a plan view of the semiconductor device. Here, FIG. 6A illustrates a cross section taken along line C1-C2 and line D1-D2 in FIG. 6B. In addition, FIG. 6C is an example of a diagram of a circuit using the semiconductor device as a memory element. In the semiconductor device illustrated in FIGS. 6A and 6B, a transistor 500 formed using a first semiconductor material is provided in a lower portion, and the transistor 120 described in the above embodiment is provided in an upper portion. Note that the transistor 120 is formed using an oxide semiconductor as a second semiconductor material. In this embodiment, the first semiconductor material is a semiconductor material other than an oxide semiconductor. As the semiconductor material other than an oxide semiconductor, for example, silicon, germanium, silicon germanium, silicon carbide, or gallium arsenide can be used, and a single crystal semiconductor is preferably used. Alternatively, an organic semiconductor material or the like may be used. A transistor formed using such a semiconductor material can operate at high speed easily. On the other hand, one of features of a transistor formed using an oxide semiconductor is extremely small off-state current, which enables charge to be held for a long time.

Note that in this embodiment, an example in which the storage medium is formed using the transistor 120 is described; needless to say, any of the transistor 130, the transistor 140, and the transistor 150 described in the above embodiment, and the like can be used instead of the transistor 120.

The transistor 500 in FIGS. 6A to 6C includes a channel formation region 416 provided in a substrate 400 including a semiconductor material (e.g., silicon); impurity regions 420 provided so that the channel formation region 416 is interposed therebetween; metal compound regions 424 in contact with the impurity regions 420; a gate insulating layer 408 provided over the channel formation region 416; and a gate electrode 410 provided over the gate insulating layer 408.

As the substrate 400 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film formed using a material other than silicon is provided over an insulating surface. That is, a semiconductor film included in the "SOI substrate" is not limited to a silicon semiconductor film. Moreover, the SOI substrate can be a substrate in which a semiconductor film is provided over an insulating substrate such as a glass substrate with an insulating layer positioned therebetween.

An element isolation insulating layer 406 is provided over the substrate 400 so as to surround the transistor 500. Note that it is preferable that the transistor 500 be not provided with a sidewall insulating layer as illustrated in FIGS. 6A and 6B to achieve higher integration. On the other hand, in the case where the characteristics of the transistor 500 have priority, sidewall insulating layers may be provided on side surfaces of the gate electrode 410, and the impurity regions 420 including regions with different impurity concentrations may be provided.

The transistor 500 can be manufactured using silicon, germanium, silicon germanium, silicon carbide, gallium arsenide, or the like. The transistor 500 can operate at high speed. Thus, when the transistor is used as a reading transistor, data can be read out at high speed.

The insulating film 53 is provided over the transistor 500 so that an upper surface of the gate electrode 410 is exposed. As in the above embodiment, the oxide semiconductor film 59 is provided over and in contact with the insulating film 53. The description in the above embodiment can be referred to for details of the insulating film 53 and its formation method. In this manner, by forming the crystalline oxide semiconductor film 59 over and in contact with the insulating film 53 whose surface roughness is reduced, the crystallinity of the oxide semiconductor film 59 can be further improved. Thus, the transistor 120 formed using the oxide semiconductor film 59 can have stable electric characteristics, and the mobility of the transistor 120 can be improved.

At the same time as planarizing the insulating film 53 by CMP treatment or the like as in the above embodiment, the upper surface of the gate electrode 410 can be exposed.

As in the above embodiment, the transistor 120 includes the oxide semiconductor film 59, the source electrode 61a, the drain electrode 61b, the gate insulating film 63, and a gate electrode 65a. As for details, the description in the above embodiment can be referred to. A transistor in the upper portion, which is typified by the transistor 120, can be manufactured by the method described in the above embodiment.

Here, the crystalline oxide semiconductor film used in the transistor 120 has a certain level or more of crystallinity, which is favorable as compared with an entirely amorphous oxide semiconductor film; therefore, defects typified by oxygen vacancies and impurities such as hydrogen bonded to dangling bonds or the like are reduced. Therefore, the crystalline oxide semiconductor film in which these are reduced has stable electric characteristics and is more electrically stable with respect to irradiation with visible light, ultraviolet light, and the like. By using such a crystalline oxide semiconductor film for a transistor, a highly reliable semiconductor device having stable electric characteristics can be provided.

Here, the source electrode 61a is provided in contact with the gate electrode 410; thus, the gate electrode 410 of the transistor 500 and the source electrode 61a of the transistor 120 are connected to each other.

Further, a wiring 65c in the same layer as the gate electrode 65a is provided over the source electrode 61a with the gate insulating film 63 positioned therebetween, so that a capacitor 520 can be formed. In the case where a capacitor is not needed, it is possible to employ a structure without the capacitor 520.

Then, the insulating film 69 and an insulating layer 152 are formed over the gate insulating film 63, the gate electrode 65a, and the wiring 65c. The description in the above embodiment can be referred to for details of the insulating film 69. The insulating layer 152 can be formed by a sputtering method, a CVD method, or the like. The insulating layer 152 can be formed using a material including an inorganic insulating material such as silicon oxide, silicon oxynitride, silicon nitride, hafnium oxide, aluminum oxide, or gallium oxide.

A wiring 156 is formed over the insulating layer 152. The wiring 156 is electrically connected to the drain electrode 61b through an electrode 154 formed in an opening provided in the gate insulating film 63, the insulating film 69, and the insulating layer 152.

The electrode 154 can be formed in such a manner, for example, that a conductive film is formed in a region including the opening by a PVD method, a CVD method, or the like and then part of the conductive film is removed by etching treatment, CMP, or the like.

The wiring 156 can be formed in such a manner that a conductive layer is formed by a PVD method such as a sputtering method or a CVD method such as a plasma CVD method and then the conductive layer is patterned. The wiring 156 can be formed using a material similar to that of the source electrode 61a and the drain electrode 61b.

In the semiconductor device described in this embodiment, the transistor 500 and the transistor 120 overlap with each other; thus, the integration degree of the semiconductor device can be sufficiently high.

FIG. 6C is an example of a diagram of a circuit using the semiconductor device as a memory element. In FIG. 6C, one of a source electrode and a drain electrode of the transistor 120, one electrode of the capacitor 520, and a gate electrode of the transistor 500 are electrically connected to one another. A first wiring (1st Line, also referred to as source line) is electrically connected to a source electrode of the transistor 500. A second wiring (2nd Line, also referred to as bit line) is electrically connected to a drain electrode of the transistor 500. A third wiring (3rd Line, also referred to as first signal line) is electrically connected to the other of the source electrode and the drain electrode of the transistor 120. A fourth wiring (4th Line, also referred to as second signal line) is electrically connected to a gate electrode of the transistor 120. A fifth wiring (5th Line, also referred to as word line) is electrically connected to the other electrode of the capacitor 520.

The transistor 120 formed using an oxide semiconductor has extremely small off-state current; therefore, when the transistor 120 is in an off state, the potential of a node (hereinafter node FG) where the one of the source electrode and the drain electrode of the transistor 120, the one electrode of the capacitor 520, and the gate electrode of the transistor 500 are electrically connected to one another can be held for an extremely long time. Provision of the capacitor 520 facilitates holding of charge applied to the node FG and reading of stored data.

When data is stored in the semiconductor device (writing), the potential of the fourth wiring is set to a potential at which the transistor 120 is turned on, whereby the transistor 120 is turned on. Thus, the potential of the third wiring is supplied to the node FG and a predetermined amount of charge is accumulated in the node FG. Here, charge for applying either of two different potential levels (hereinafter referred to as low-level charge and high-level charge) is applied to the node FG. After that, the potential of the fourth wiring is set to a potential at which the transistor 120 is turned off, whereby the transistor 120 is turned off. This makes the node FG floating and the predetermined amount of charge is held in the node FG. The predetermined amount of charge is thus accumulated and held in the node FG, whereby the memory cell can store data.

Since the off-state current of the transistor 120 is extremely small, the charge applied to the node FG is held for a long time. This can remove the need of refresh operation or drastically reduce the frequency of the refresh operation, which leads to a sufficient reduction in power consumption. Moreover, stored data can be held for a long time even when power is not supplied.

When stored data is read out (reading), while a predetermined potential (fixed potential) is supplied to the first wiring, an appropriate potential (read-out potential) is supplied to the fifth wiring, whereby the transistor 500 changes its state depending on the amount of charge held in the node FG. This is because, in general, when the transistor 500 is an n-channel transistor, an apparent threshold voltage $V_{th\_H}$ of the transistor 500 in the case where the high-level charge is held in the node FG is lower than an apparent threshold voltage $V_{th\_L}$ of the transistor 500 in the case where the low-level charge is held in the node FG. Here, the apparent threshold voltage refers to the potential of the fifth wiring, which is needed to turn on the transistor 500. Thus, by setting the potential of the fifth wiring to a potential $V_0$ which is between $V_{th\_H}$ and $V_{th\_L}$, charge held in the node FG can be determined. For example, in the case where the high-level charge is applied in writing, the transistor 500 is turned on when the potential of the fifth wiring is set to $V_0$ ($>V_{th\_H}$). In the case where the low-level charge is applied in writing, even when the potential of the fifth wiring is set to $V_0$ ($<V_{th\_L}$), the transistor 500 remains in an off state. In such a manner, by controlling the potential of the fifth wiring and determining whether the transistor 500 is in an on state or off state (reading the potential of the second wiring), stored data can be read out.

Further, in order to rewrite stored data, a new potential is supplied to the node FG that is holding the predetermined amount of charge applied in the above writing, so that charge of the new data is held in the node FG. Specifically, the potential of the fourth wiring is set to a potential at which the transistor 120 is turned on, whereby the transistor 120 is turned on. Thus, the potential of the third wiring (potential of new data) is supplied to the node FG, and the predetermined amount of charge is accumulated in the node FG. After that, the potential of the fourth wiring is set to a potential at which the transistor 120 is turned off, whereby the transistor 120 is turned off. Thus, charge of the new data is held in the node FG. In other words, while the predetermined amount of charge applied in the first writing is held in the node FG, the same operation (second writing) as in the first writing is performed, whereby the stored data can be overwritten.

The off-state current of the transistor 120 described in this embodiment can be sufficiently reduced by using the highly purified intrinsic oxide semiconductor film 59. Further, the crystalline oxide semiconductor film 59 is formed over and in contact with the insulating film 53 whose surface roughness is reduced, whereby the oxide semiconductor film 59 can have stable electric characteristics. By using the oxide semiconductor film 59 for the transistor 120, a highly reliable transistor having stable electric characteristics can be provided. Further, with the use of such a transistor, a highly reliable semiconductor device capable of holding stored data for an extremely long time can be obtained.

Moreover, the oxide semiconductor film 59 having high crystallinity can be formed; therefore, by using the oxide semiconductor film 59, the transistor 120 can have higher mobility. With the use of such a transistor, high-speed operation of the semiconductor device can be achieved.

The methods, structures, and the like described in this embodiment can be combined as appropriate with any of the methods, structures, and the like described in the other embodiments.

Embodiment 4

In this embodiment, application examples of a semiconductor device according to one embodiment of the invention disclosed herein will be described with reference to FIGS. 7A and 7B.

Figure 7A:
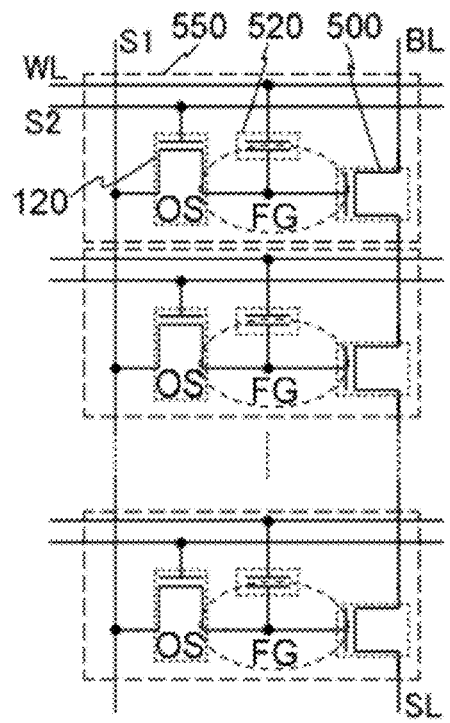
FIGS. 7A and 7B are each an equivalent circuit diagram of a semiconductor device according to one embodiment of the present invention.
Figure 7B:
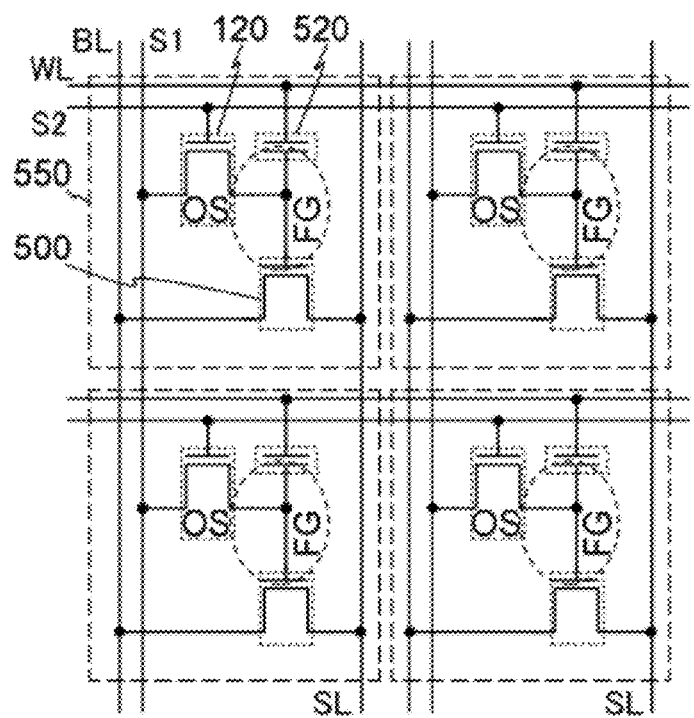

FIGS. 7A and 7B are circuit diagrams of semiconductor devices each including a plurality of semiconductor devices (hereinafter also referred to as memory cell 550) illustrated in FIGS. 6A to 6C. FIG. 7A is a circuit diagram of a so-called NAND semiconductor device in which the memory cells 550 are connected in series, and FIG. 7B is a circuit diagram of a so-called NOR semiconductor device in which the memory cells 550 are connected in parallel.

The semiconductor device in FIG. 7A includes a source line SL, a bit line BL, a first signal line S1, a plurality of second signal lines S2, a plurality of word lines WL, and the plurality of memory cells 550. In FIG. 7A, one source line SL and one bit line BL are provided in the semiconductor device; however, one embodiment of the invention disclosed herein is not limited to this. A plurality of source lines SL and a plurality of bit lines BL may be provided.

In each of the memory cells 550, a gate electrode of the transistor 500, one of a source electrode and a drain electrode of the transistor 120, and one electrode of the capacitor 520 are electrically connected to one another. The first signal line S1 and the other of the source electrode and the drain electrode of the transistor 120 are electrically connected to each other, and the second signal line S2 and the gate electrode of the transistor 120 are electrically connected to each other. The word line WL and the other electrode of the capacitor 520 are electrically connected to each other.

Further, a source electrode of the transistor 500 included in the memory cell 550 is electrically connected to a drain electrode of the transistor 500 in the adjacent memory cell 550. The drain electrode of the transistor 500 included in the memory cell 550 is electrically connected to the source electrode of the transistor 500 in the adjacent memory cell 550. Note that the drain electrode of the transistor 500 included in the memory cell 550 of the plurality of memory cells connected in series, which is provided at one end, is electrically connected to the bit line. In addition, the source electrode of the transistor 500 included in the memory cell 550 of the plurality of memory cells connected in series, which is provided at the other end, is electrically connected to the source line.

In the semiconductor device in FIG. 7A, writing operation and reading operation are performed for each row. The writing operation is performed as follows. A potential at which the transistor 120 is turned on is supplied to the second signal line S2 of a row where writing is to be performed, whereby the transistor 120 of the row where writing is to be performed is turned on. Accordingly, the potential of the first signal line S1 is supplied to the gate electrode of the transistor 500 of the specified row, so that predetermined charge is applied to the gate electrode. Thus, data can be written into the memory cell of the specified row.

Further, the reading operation is performed as follows. First, a potential at which the transistor 500 is turned on regardless of charge applied to the gate electrode of the transistor 500 is supplied to the word lines WL of the rows other than the row where reading is to be performed, so that the transistors 500 of the rows other than the row where reading is to be performed are turned on. Then, a potential (read-out potential) at which an on state or an off state of the transistor 500 is determined depending on charge in the gate electrode of the transistor 500 is supplied to the word line WL of the row where reading is to be performed. After that, a fixed potential is supplied to the source line SL so that a reading circuit (not shown) connected to the bit line BL is operated. Here, the plurality of transistors 500 between the source line SL and the bit line BL are on except the transistor 500 of the row where reading is to be performed; therefore, the conductance between the source line SL and the bit line BL is determined by the state (on state or off state) of the transistor 500 of the row where reading is to be performed. The conductance of the transistor 500 of the row where reading is to be performed depends on charge in the gate electrode thereof. Thus, the potential of the bit line BL varies accordingly. By reading the potential of the bit line with the reading circuit, data can be read out from the memory cell of the specified row.

The semiconductor device in FIG. 7B includes a plurality of source lines SL, a plurality of bit lines BL, a plurality of first signal lines S1, a plurality of second signal lines S2, a plurality of word lines WL, and the plurality of memory cells 550. A gate electrode of the transistor 500, one of a source electrode and a drain electrode of the transistor 120, and one electrode of the capacitor 520 are electrically connected to one another. The source line SL and a source electrode of the transistor 500 are electrically connected to each other. The bit line BL and a drain electrode of the transistor 500 are electrically connected to each other. The first signal line S1 and the other of the source electrode and the drain electrode of the transistor 120 are electrically connected to each other, and the second signal line S2 and a gate electrode of the transistor 120 are electrically connected to each other. The word line WL and the other electrode of the capacitor 520 are electrically connected to each other.

In the semiconductor device in FIG. 7B, writing operation and reading operation are performed for each row. The writing operation is performed in a manner similar to that in the semiconductor device in FIG. 7A. The reading operation is performed as follows. First, a potential at which the transistor 500 is turned off regardless of charge applied to the gate electrode of the transistor 500 is supplied to the word lines WL of the rows other than the row where reading is to be performed, so that the transistors 500 of the rows other than the row where reading is to be performed are turned off. Then, a potential (read-out potential) at which an on state or an off state of the transistor 500 is determined depending on charge in the gate electrode of the transistor 500 is supplied to the word line WL of the row where reading is to be performed. After that, a fixed potential is supplied to the source lines SL so that a reading circuit (not shown) connected to the bit lines BL is operated. Here, the conductance between the source lines SL and the bit lines BL is determined by the state (on state or off state) of the transistors 500 of the row where reading is to be performed. That is, the potential of the bit lines BL varies depending on charge in the gate electrodes of the transistors 500 of the row where reading is to be performed. By reading the potential of the bit lines BL with the reading circuit, data can be read out from the memory cells of the specified row.

Although the amount of data which can be stored in each of the memory cells 550 is one bit in the above description, the structure of the memory device of this embodiment is not limited to this. The amount of data which can be stored in each of the memory cells 550 may be increased by preparing three or more potentials to be supplied to the gate electrode of the transistor 500. For example, in the case where the number of potentials to be supplied to the gate electrode of the transistor 500 is four, data of two bits can be stored in each of the memory cells.

The methods, structures, and the like described in this embodiment can be combined as appropriate with any of the methods, structures, and the like described in the other embodiments.

Embodiment 5

In this embodiment, examples of a semiconductor device formed using the transistor described in any of the above embodiments will be described with reference to FIGS. 8A and 8B.

Figure 8A:
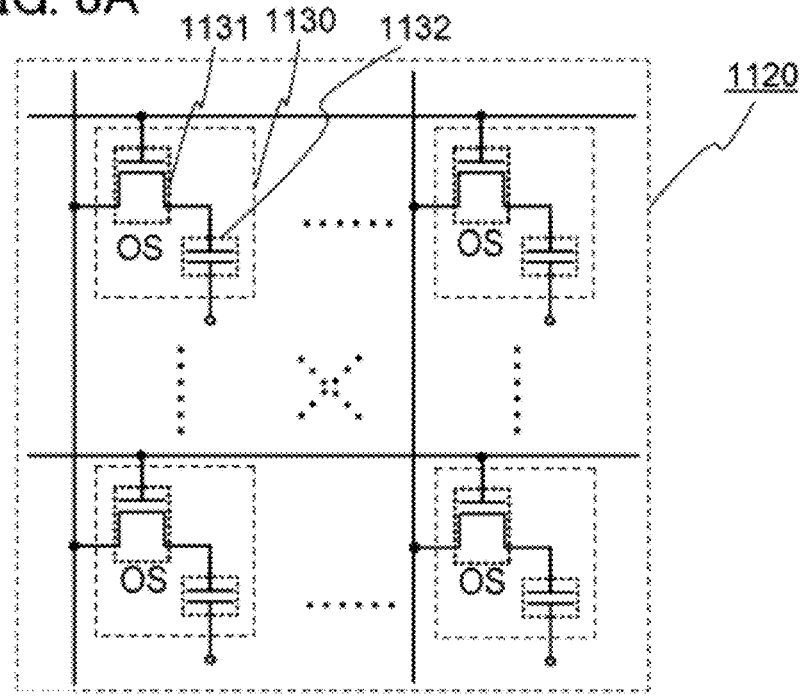
FIGS. 8A and 8B are each an equivalent circuit diagram of a semiconductor device according to one embodiment of the present invention.

FIG. 8A illustrates an example of a semiconductor device having a structure corresponding to that of a so-called dynamic random access memory (DRAM). A memory cell array 1120 illustrated in FIG. 8A has a structure in which a plurality of memory cells 1130 is arranged in a matrix. Further, the memory cell array 1120 includes m first wirings and n second wirings. Note that in this embodiment, the first wiring and the second wiring are referred to as bit line BL and word line WL, respectively.

The memory cell 1130 includes a transistor 1131 and a capacitor 1132. A gate electrode of the transistor 1131 is connected to the first wiring (word line WL). Further, one of a source electrode and a drain electrode of the transistor 1131 is connected to the second wiring (bit line BL). The other of the source electrode and the drain electrode of the transistor 1131 is connected to one electrode of the capacitor. The other electrode of the capacitor is connected to a capacitor line CL and is supplied with a predetermined potential. The transistor 120, the transistor 130, the transistor 140, or the transistor 150, which is described in the above embodiments, is applied to the transistor 1131.

The transistor described in any of the above embodiments is formed using a highly purified intrinsic oxide semiconductor film and thus can have sufficiently low off-state current. Further, a crystalline oxide semiconductor film is formed over and in contact with an insulating film whose surface roughness is reduced, whereby the oxide semiconductor film can have stable electric characteristics. By using such an oxide semiconductor film for a transistor, a highly reliable transistor having stable electric characteristics can be provided. Further, with the use of such a transistor, the semiconductor device in FIG. 8A, which is regarded as a so-called DRAM, can be used as a substantially nonvolatile memory.

Figure 8B:
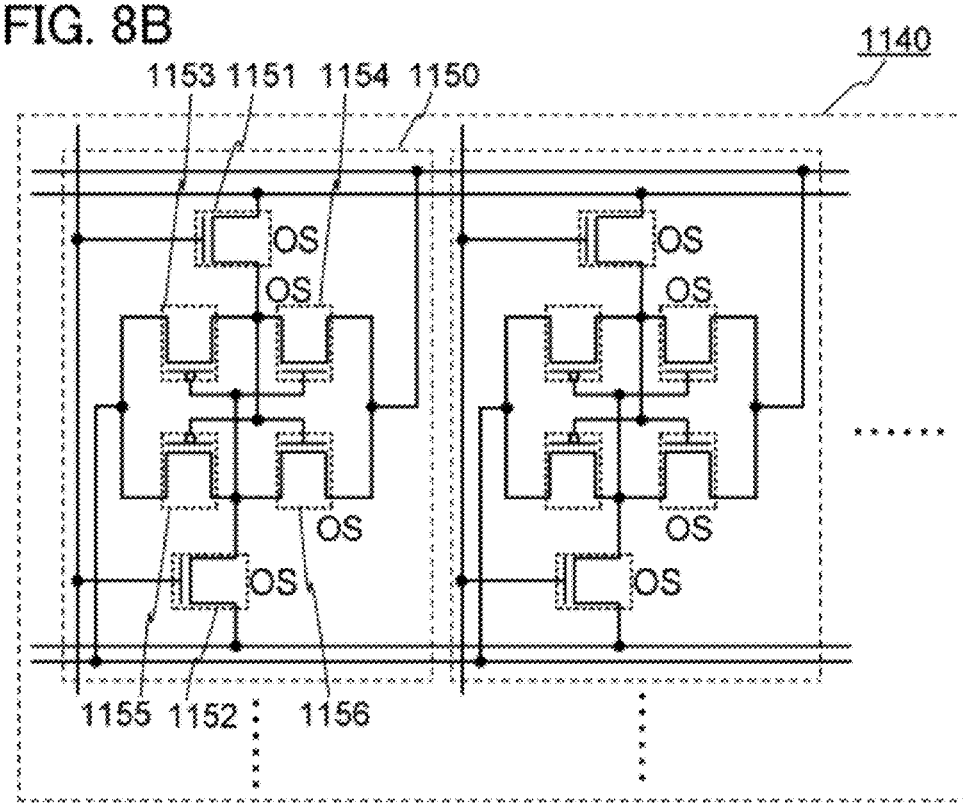

FIG. 8B illustrates an example of a semiconductor device having a structure corresponding to that of a so-called static random access memory (SRAM). A memory cell array 1140 illustrated in FIG. 8B can have a structure in which a plurality of memory cells 1150 is arranged in a matrix. Further, the memory cell array 1140 includes a plurality of first wirings (word lines WL), a plurality of second wirings (bit lines BL), and a plurality of third wirings (inverted bit lines /BL).

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors, and the transistor described in any of the above embodiments can be applied to these transistors. Each of the third transistor 1153 and the fifth transistor 1155 is a p-channel transistor in which a channel formation region is formed using a material (e.g., single crystal silicon) other than an oxide semiconductor.

The methods, structures, and the like described in this embodiment can be combined as appropriate with any of the methods, structures, and the like described in the other embodiments.

Embodiment 6

A central processing unit (CPU) can be formed using a transistor in which a channel formation region is formed using an oxide semiconductor for at least part of the CPU.

Figure 9A:
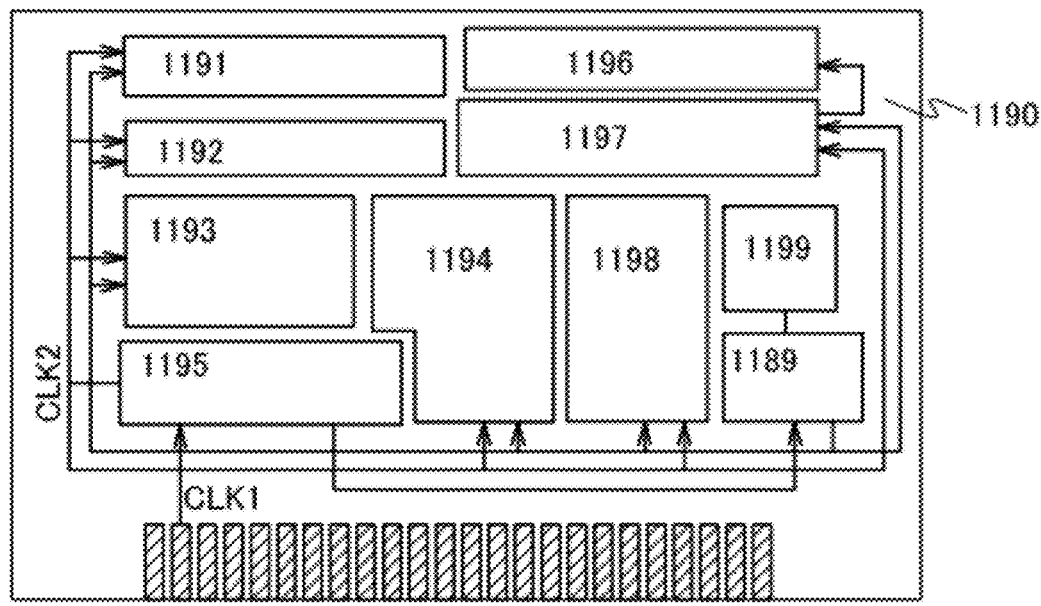
FIGS. 9A to 9C are block diagrams of a semiconductor device according to one embodiment of the present invention.

FIG. 9A is a block diagram illustrating a specific structure of a CPU. The CPU illustrated in FIG. 9A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Needless to say, the CPU illustrated in FIG. 9A is just an example in which the structure is simplified, and an actual CPU may have various structures depending on the application.

An instruction that is input to the CPU through the Bus I/F 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 9A, a memory element is provided in the register 1196. The memory element described in any of Embodiments 3 to 5 can be used as the memory element provided in the register 1196.

In the CPU illustrated in FIG. 9A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 9B:
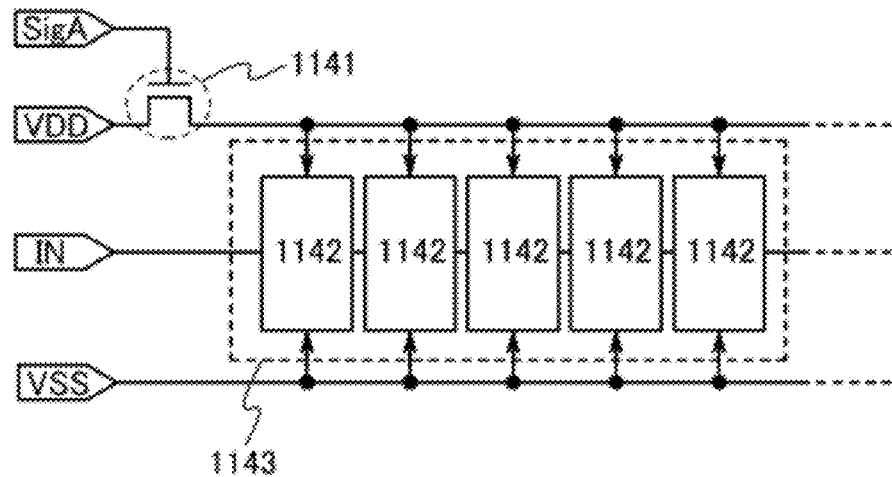
Figure 9C:
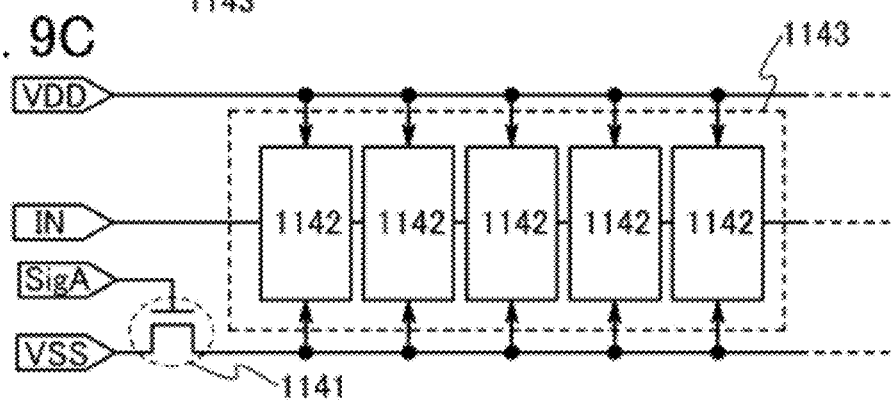

The power supply can be stopped by providing a switching element between a memory element group and a node to which a power supply potential VDD or a power supply potential VSS is supplied, as illustrated in FIG. 9B or FIG. 9C. Circuits illustrated in FIGS. 9B and 9C will be described below.

FIGS. 9B and 9C each illustrate an example of a structure of a memory circuit including a transistor in which a channel formation region is formed using an oxide semiconductor as a switching element for controlling supply of a power supply potential to a memory element.

The memory device illustrated in FIG. 9B includes a switching element 1141 and a memory element group 1143 including a plurality of memory elements 1142. Specifically, as each of the memory elements 1142, the memory element described in any of Embodiments 3 to 5 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 9B, a transistor in which a channel formation region is formed using an oxide semiconductor is used as the switching element 1141, and the switching of the transistor is controlled by a signal Sig A supplied to a gate electrode thereof.

Note that FIG. 9B illustrates the structure in which the switching element 1141 includes only one transistor; however, without limitation thereto, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 9B, the switching element 1141 may control the supply of the low-level power supply potential VSS.

In FIG. 9C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The methods, structures, and the like described in this embodiment can be combined as appropriate with any of the methods, structures, and the like described in the other embodiments.

Embodiment 7

In this embodiment, an example in which at least part of a driver circuit and a transistor to be disposed in a pixel portion are formed over one substrate will be described below.

The transistor to be disposed in the pixel portion is formed in accordance with the method described in the above embodiment. Further, the transistor can be easily formed as an n-channel transistor, and thus part of a driver circuit that can be formed using an n-channel transistor in the driver circuit is formed over the same substrate as the transistor of the pixel portion. By using the transistor described in any of the above embodiments for the pixel portion or the driver circuit as described above, a highly reliable display device can be provided.

Figure 10A:
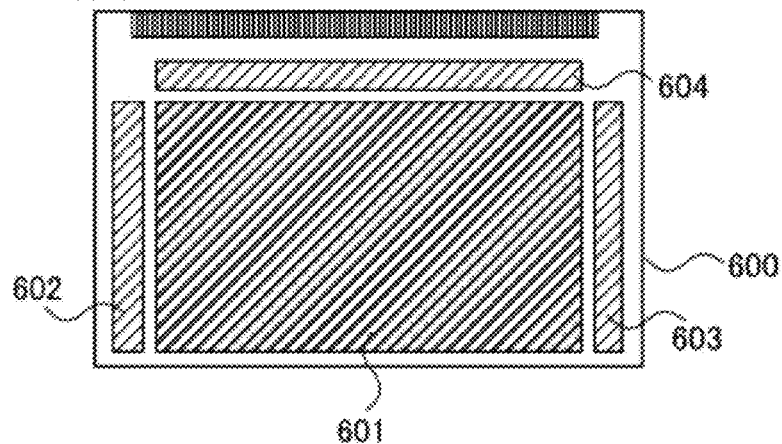
FIGS. 10A to 10C are a block diagram and equivalent circuit diagrams which illustrate one embodiment of the present invention.

FIG. 10A is an example of a block diagram of an active matrix display device. A pixel portion 601, a first scan line driver circuit 602, a second scan line driver circuit 603, and a signal line driver circuit 604 are provided over a substrate 600 in the display device. In the pixel portion 601, a plurality of signal lines extended from the signal line driver circuit 604 is arranged and a plurality of scan lines extended from the first scan line driver circuit 602 and the second scan line driver circuit 603 is arranged. Note that pixels which include display elements are provided in a matrix in respective regions where the scan lines and the signal lines intersect with each other. The substrate 600 of the display device is connected to a timing control circuit (also referred to as controller or control IC) through a connection portion such as a flexible printed circuit (FPC).

In FIG. 10A, the first scan line driver circuit 602, the second scan line driver circuit 603, and the signal line driver circuit 604 are formed over the same substrate 600 as the pixel portion 601. Accordingly, the number of components of a driver circuit and the like provided outside is reduced, so that a reduction in cost can be achieved. Further, if the driver circuit is provided outside the substrate 600, wirings would need to be extended and the number of connections of wirings would be increased, but by providing the driver circuit over the substrate 600, the number of connections of the wirings can be reduced. Accordingly, the reliability or yield can be improved.

Figure 10B:
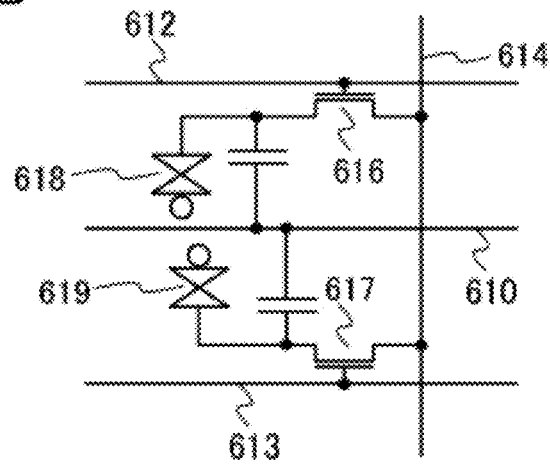

FIG. 10B illustrates an example of a circuit structure of the pixel portion. Here, a pixel structure of a VA liquid crystal display panel is shown.

In this pixel structure, a plurality of pixel electrode layers is provided in one pixel, and transistors are connected to respective pixel electrode layers. The plurality of transistors is driven by different gate signals. In other words, signals applied to individual pixel electrode layers in a multi-domain pixel are controlled independently.

A gate wiring 612 of a transistor 616 and a gate wiring 613 of a transistor 617 are separated from each other so that different gate signals can be supplied thereto. In contrast, a source or drain electrode layer 614 functioning as a data line is used in common for the transistor 616 and the transistor 617. As the transistor 616 and the transistor 617, the transistor described in any of the above embodiments can be used as appropriate. In the above manner, a highly reliable liquid crystal display panel can be provided.

A first pixel electrode layer electrically connected to the transistor 616 and a second pixel electrode layer electrically connected to the transistor 617 have different shapes and are separated by a slit. The second pixel electrode layer is provided so as to surround the external side of the first pixel electrode layer which spreads in a V shape. Timing of voltage application is made to vary between the first pixel electrode layer and the second pixel electrode layer by the transistor 616 and the transistor 617 in order to control alignment of liquid crystal. The transistor 616 is connected to the gate wiring 612, and the transistor 617 is connected to the gate wiring 613. When different gate signals are supplied to the gate wiring 612 and the gate wiring 613, operation timings of the transistor 616 and the transistor 617 can be varied.

Further, a storage capacitor is formed using a capacitor wiring 610, a gate insulating film functioning as a dielectric, and a capacitor electrode electrically connected to the first pixel electrode layer or the second pixel electrode layer.

The first pixel electrode layer, a liquid crystal layer, and a counter electrode layer overlap with each other to form a first liquid crystal element 618. Further, the second pixel electrode layer, the liquid crystal layer, and the counter electrode layer overlap with each other to form a second liquid crystal element 619. The pixel structure is a multi-domain structure in which the first liquid crystal element 618 and the second liquid crystal element 619 are provided in one pixel.

Note that the pixel structure is not limited to that illustrated in FIG. 10B. For example, a switch, a resistor, a capacitor, a transistor, a sensor, a logic circuit, or the like may be added to the pixel illustrated in FIG. 10B.

Figure 10C:
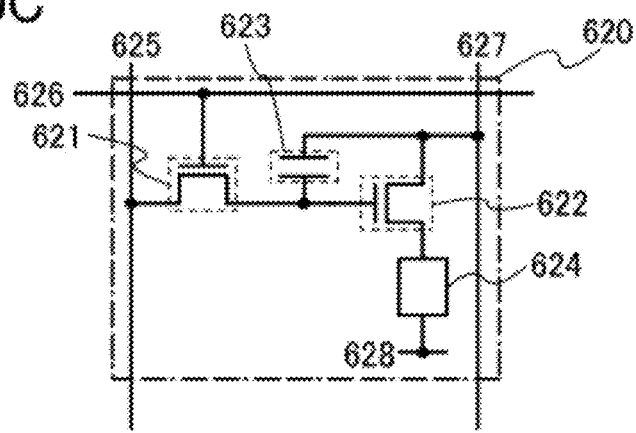

FIG. 10C illustrates an example of a circuit structure of the pixel portion. Here, a pixel structure of a display panel formed using an organic EL element is shown.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as current-excitation light-emitting element.

FIG. 10C illustrates an example of a pixel structure to which digital time grayscale driving can be applied, as an example of a semiconductor device.

A structure and operation of a pixel to which digital time grayscale driving can be applied will be described. Here, one pixel includes two n-channel transistors each of which includes an oxide semiconductor layer as a channel formation region.

A pixel 620 includes a switching transistor 621, a driver transistor 622, a light-emitting element 624, and a capacitor 623. A gate electrode layer of the switching transistor 621 is connected to a scan line 626, a first electrode (one of a source electrode layer and a drain electrode layer) of the switching transistor 621 is connected to a signal line 625, and a second electrode (the other of the source electrode layer and the drain electrode layer) of the switching transistor 621 is connected to a gate electrode layer of the driver transistor 622. The gate electrode layer of the driver transistor 622 is connected to a power supply line 627 through the capacitor 623, a first electrode of the driver transistor 622 is connected to the power supply line 627, and a second electrode of the driver transistor 622 is connected to a first electrode (pixel electrode) of the light-emitting element 624. A second electrode of the light-emitting element 624 corresponds to a common electrode 628. The common electrode 628 is electrically connected to a common potential line formed over the same substrate as the common electrode 628.

As the switching transistor 621 and the driver transistor 622, the transistor described in any of the above embodiments can be used as appropriate. In this manner, a highly reliable display panel formed using an organic EL element can be provided.

The second electrode (common electrode 628) of the light-emitting element 624 is set to a low power supply potential. Note that the low power supply potential is a potential satisfying the relation, the low power supply potential<a high power supply potential with the high power supply potential set to the power supply line 627 as a reference. For example, GND, 0 V, or the like may be set as the low power supply potential. A potential difference between the high power supply potential and the low power supply potential is applied to the light-emitting element 624 and current is supplied to the light-emitting element 624, so that the light-emitting element 624 emits light. Here, in order to make the light-emitting element 624 emit light, each potential is set so that the potential difference between the high power supply potential and the low power supply potential is greater than or equal to forward threshold voltage of the light-emitting element 624.

Note that gate capacitance of the driver transistor 622 may be used as a substitute for the capacitor 623, so that the capacitor 623 can be omitted. The gate capacitance of the driver transistor 622 may be formed between a channel formation region and the gate electrode layer.

In the case of a voltage-input voltage driving method, a video signal is input to the gate electrode layer of the driver transistor 622 so that the driver transistor 622 is in either of two states of being sufficiently turned on and turned off. That is, the driver transistor 622 operates in a linear region. Thus, voltage higher than the voltage of the power supply line 627 is applied to the gate electrode layer of the driver transistor 622. Note that voltage higher than or equal to the sum of the voltage of the power supply line and Vth of the driver transistor 622 is applied to the signal line 625.

In the case of performing analog grayscale driving instead of digital time grayscale driving, the same pixel structure as in FIG. 10C can be employed by inputting signals in a different way.

In the case of performing analog grayscale driving, voltage higher than or equal to the sum of the forward voltage of the light-emitting element 624 and Vth of the driver transistor 622 is applied to the gate electrode layer of the driver transistor 622. The forward voltage of the light-emitting element 624 indicates voltage at which a desired luminance is obtained, and includes at least forward threshold voltage. By inputting a video signal which enables the driver transistor 622 to operate in a saturation region, current can be supplied to the light-emitting element 624. In order for the driver transistor 622 to operate in the saturation region, the potential of the power supply line 627 is set higher than a gate potential of the driver transistor 622. When an analog video signal is used, it is possible to supply current to the light-emitting element 624 in accordance with the video signal and perform analog grayscale driving.

Note that the pixel structure is not limited to that illustrated in FIG. 10C. For example, a switch, a resistor, a capacitor, a sensor, a transistor, a logic circuit, or the like may be added to the pixel illustrated in FIG. 10C.

The methods, structures, and the like described in this embodiment can be combined as appropriate with any of the methods, structures, and the like described in the other embodiments.

Embodiment 8

A semiconductor device disclosed in this specification can be applied to a variety of electronic devices (including game machines). Examples of electronic devices are a television set (also referred to as television or television receiver), a monitor of a computer or the like, a camera such as a digital camera or a digital video camera, a digital photo frame, a mobile phone (also referred to as cellular phone or cellular phone device), a portable game machine, a portable information terminal, an audio reproducing device, and a large-sized game machine such as a pachinko machine. Examples of electronic devices each including the semiconductor device described in any of the above embodiments will be described.

Figure 11A:
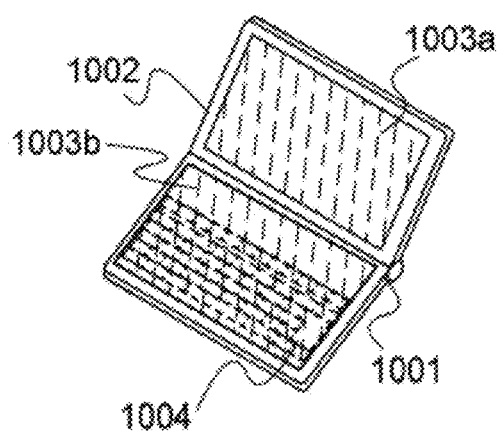
FIGS. 11A to 11D are external views each illustrating an electronic device according to one embodiment of the present invention.

FIG. 11A illustrates a portable information terminal, which includes a main body 1001, a housing 1002, display portions 1003a and 1003b, and the like. The display portion 1003b is a touch panel. By touching a keyboard button 1004 displayed on the display portion 1003b, a screen can be operated and text can be input. Needless to say, the display portion 1003a may be a touch panel. A liquid crystal panel or an organic light-emitting panel is manufactured by using the transistor described in any of the above embodiments as a switching element and applied to the display portion 1003a or 1003b, whereby the reliability of the display portion of the portable information terminal can be improved.

The portable information terminal illustrated in FIG. 11A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (such as an earphone terminal or a USB terminal), a recording medium insertion portion, and the like may be provided on the back surface or the side surface of the housing.

The portable information terminal illustrated in FIG. 11A may transmit and receive data wirelessly. Through wireless communication, desired book data or the like can be purchased and downloaded from an electronic book server.

Figure 11B:
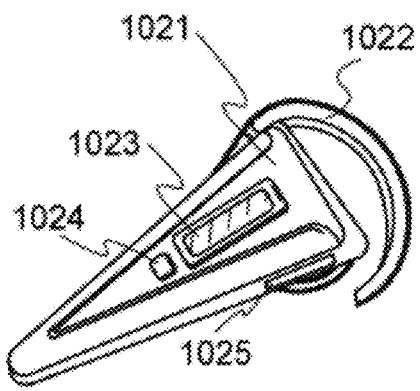

FIG. 11B illustrates a portable music player, which includes, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is manufactured by using the transistor described in any of the above embodiments as a switching element and applied to the display portion 1023, whereby the reliability of the display portion of the portable music player can be improved.

Furthermore, when the portable music player illustrated in FIG. 11B has an antenna, a microphone function, and a wireless communication function and is used with a mobile phone, a user can talk on the phone wirelessly in a hands-free way while driving a car or the like.

Figure 11C:
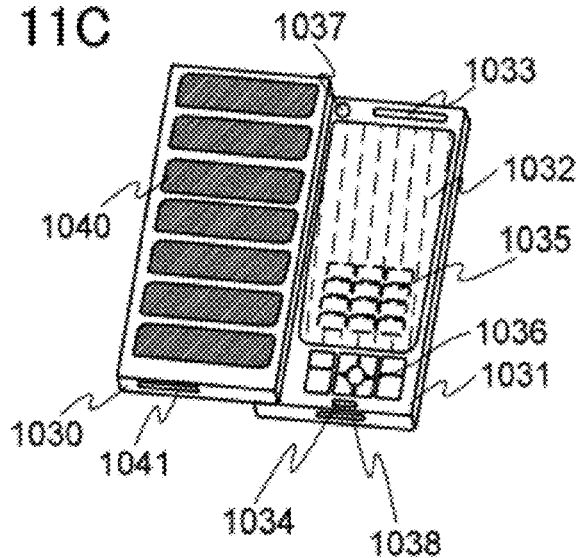

FIG. 11C illustrates a mobile phone, which includes two housings, a housing 1030 and a housing 1031. The housing 1031 includes a display panel 1032, a speaker 1033, a microphone 1034, a pointing device 1036, a camera lens 1037, an external connection terminal 1038, and the like. Further, the housing 1030 includes a solar cell 1040 for charge of the portable information terminal, an external memory slot 1041, and the like. In addition, an antenna is incorporated in the housing 1031. The transistor described in the any of the above embodiments is applied to the display panel 1032, whereby the reliability of the display portion of the mobile phone can be improved.

Further, the display panel 1032 includes a touch panel. A plurality of operation keys 1035 displayed as images is indicated by dotted lines in FIG. 11C. Note that a boosting circuit by which voltage output from the solar cell 1040 is increased to be sufficiently high for each circuit is also included.

In the display panel 1032, the direction of display is changed as appropriate depending on a usage pattern. Further, the mobile phone is provided with the camera lens 1037 on the same surface as the display panel 1032, and thus it can be used as a video phone. The speaker 1033 and the microphone 1034 can be used for videophone calls, recording and playing sound, and the like as well as voice calls. Moreover, the housings 1030 and 1031 in a state where they are developed as illustrated in FIG. 11C can shift by sliding so that one is lapped over the other. Therefore, the size of the mobile phone can be reduced, which makes the mobile phone suitable for being carried.

The external connection terminal 1038 can be connected to an AC adaptor and various types of cables such as a USB cable, whereby charge and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 11D:
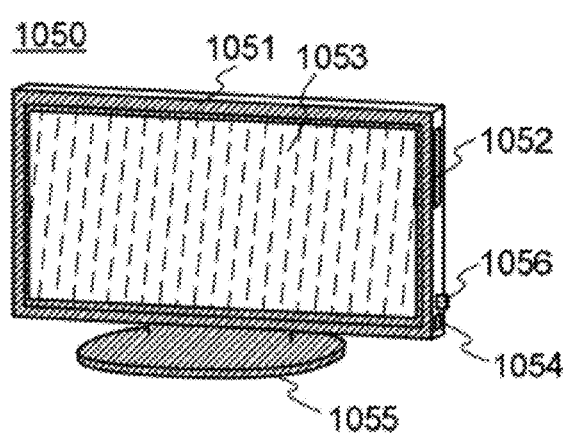

FIG. 11D illustrates an example of a television set. In a television set 1050, a display portion 1053 is incorporated in a housing 1051. Images can be displayed on the display portion 1053. Here, the housing 1051 is supported on a stand 1055 provided with a CPU. The transistor described in any of the above embodiments is applied to the display portion 1053, whereby the reliability of the display portion of the television set 1050 can be improved.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the receiver, a general television broadcast can be received. Moreover, when the television set is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading out data stored in the storage medium and writing data into the storage medium can be performed. In addition, an image, a video, or the like stored as data in an external memory 1056 inserted into the external memory slot can be displayed on the display portion 1053.

When the memory device described in any of the above embodiments is applied to the external memory 1056 or a CPU, the television set 1050 can have high reliability and power consumption thereof can be sufficiently reduced.

The methods, structures, and the like described in this embodiment can be combined as appropriate with any of the methods, structures, and the like described in the other embodiments.

Example

In this example, results of X-ray diffraction (XRD) measurement performed on an oxide semiconductor film according to one embodiment of the present invention will be described.

In this example, Sample A to Sample F were each formed as follows: a base insulating film was formed over a single crystal silicon substrate so as to have a thickness of 300 nm, and an oxide semiconductor film (IGZO film) was formed over the base insulating film so as to have a thickness of 100 nm.

For each of Sample A and Sample B, a silicon oxide film formed by a sputtering method was used as the base insulating film. Formation conditions of the silicon oxide film were as follows: silicon oxide ($SiO_2$) was used as a target; in a deposition gas, the flow rate of Ar was 25 sccm and the flow rate of $O_2$ was 25 sccm; the pressure was 0.4 Pa; the substrate temperature was 100° C.; and a high-frequency (RF) power of 2 kW was used.

For each of Sample C and Sample D, a silicon oxynitride film formed by a CVD method was used as the base insulating film. Formation conditions of the silicon oxynitride film were as follows: in a deposition gas, the flow rate of $SiH_4$ was 4 sccm and the flow rate of $N_2O$ was 800 sccm; the pressure was 40 Pa; the substrate temperature was 400° C.; and a high-frequency (RF) power of 150 W was used.

For each of Sample E and Sample F, a thermal oxide film formed on a surface of the single crystal silicon substrate by thermal oxidation thereof was used as the base insulating film. Formation conditions of the thermal oxide film were as follows: the heat treatment temperature was 950° C.; the heat treatment time was 19 hours and 40 minutes; and the atmosphere for thermal oxidation was an atmosphere containing HCl at a proportion of 3 vol. % with respect to oxygen.

Each of Sample A to Sample F in which the base insulating films were formed in the above manners was subjected to formation of an In—Ga—Zn—O-based oxide semiconductor film by a sputtering method. The oxide semiconductor film was formed under the following conditions: a target having a composition ratio of $In_2O_3$:$Ga_2O_3$:ZnO=1:1:2 [molar ratio] was used; the pressure was 0.4 Pa; the substrate temperature was 250° C.; and a high-frequency (RF) power of 2 kW was used. Note that for Sample A, Sample C, and Sample E, a deposition gas in which the flow rate of $O_2$ was 45 sccm was used; for Sample B, Sample D, and Sample F, a deposition gas in which the flow rates of Ar and $O_2$ were 30 sccm and 15 sccm, respectively, was used.

Heat treatment was performed on Sample A to Sample F, in which the oxide semiconductor films were formed in the above manners, at a heating temperature of 650° C. for 1 hour in an oxygen atmosphere.

Figure 12:
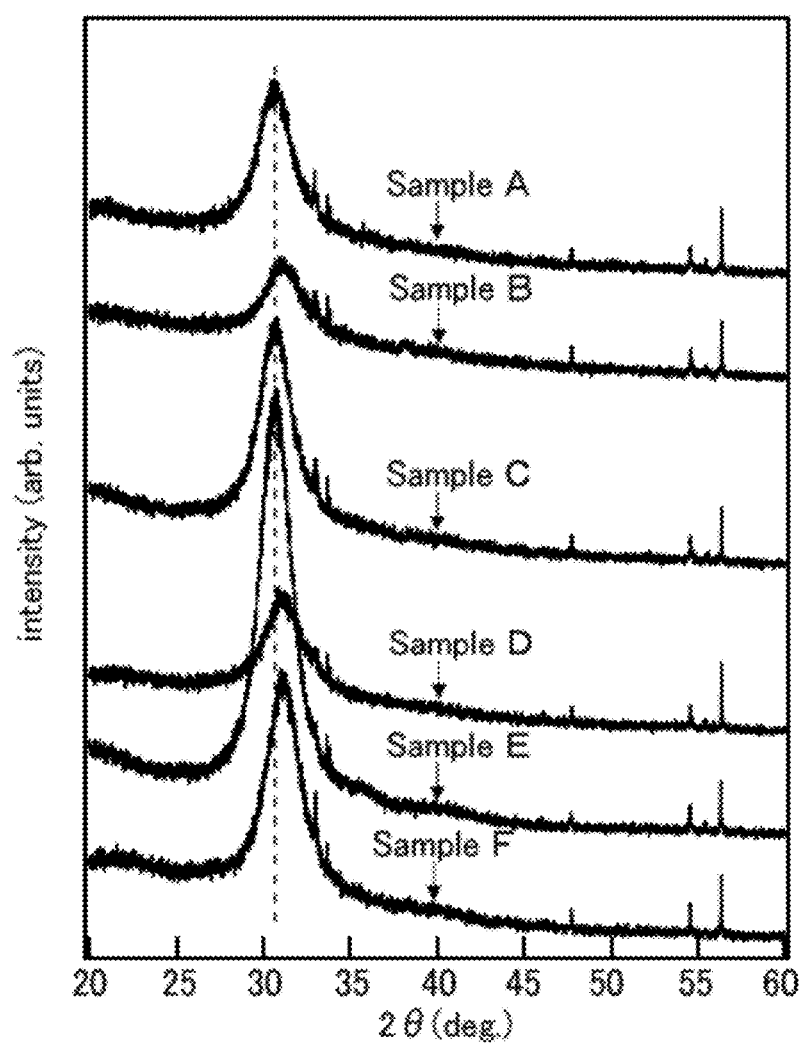
FIG. 12 shows XRD spectra according to one example of the present invention.

FIG. 12 shows results of measurement of XRD spectra of Sample A to Sample F by an out-of-plane method. In FIG. 12, the vertical axis represents the X-ray diffraction intensity (arbitrary unit), and the horizontal axis represents the rotation angle 2θ [deg.]. Note that the XRD spectra were measured with the use of an X-ray diffractometer D8 ADVANCE manufactured by Bruker AXS.

As shown in FIG. 12, in all the XRD spectra of Sample A to Sample F, peaks are observed in the vicinity of 2θ=31°. These peaks are attributed to diffraction on (009) plane of an $InGaZnO_4$ crystal. Note that the peak intensity differs among Sample A to Sample F.

According to comparison among the samples whose oxide semiconductor films were formed using only oxygen as the deposition gas, the peak intensity increases in the order of Sample A, Sample C, and Sample E. In particular, the peak intensity of Sample E is notable. The higher the peak intensity is, the higher the crystallinity of the oxide semiconductor film is. Therefore, when a thermal oxide film is used as the base insulating film, the oxide semiconductor film can have the highest crystallinity; the crystallinity gets lower in the case of using a silicon oxynitride film and in the case of using a silicon oxide film, in this order. A similar tendency can be seen among Sample B, Sample D, and Sample F, whose oxide semiconductor films were formed using argon and oxygen as the deposition gas. Being compared with Sample A, Sample C, and Sample E so that the samples including the same kind of base insulating films were compared with each other, Sample B, Sample D, and Sample F have lower crystallinity of the oxide semiconductor films. Accordingly, it can be said that an oxide semiconductor film can have higher crystallinity in the case where the oxide semiconductor film is formed in an oxygen atmosphere.

Here, the average surface roughnesses ($R_a$) of the thermal oxide film, the silicon oxynitride film, and the silicon oxide film were measured with the use of an atomic force microscope (AFM). As the AFM, SPA-500 manufactured by SII NanoTechnology Inc. was used. Conditions of the measurement were as follows: the scan rate was 1.0 Hz; and the measurement area was 1 μm×1 μm. As for the base insulating films of the samples, the average surface roughness of the thermal oxide film was 0.2 nm, that of the silicon oxynitride film was 0.5 nm, and that of the silicon oxide film was 0.9 nm. Thus, the crystallinity of the oxide semiconductor film increases as the average surface roughness of the base insulating film gets smaller, which indicates that there is a correlation between the crystallinity of the oxide semiconductor film and the planarity of the base insulating film.

In order to confirm the correlation between the crystallinity of the oxide semiconductor film and the planarity of the base insulating film, the silicon oxide film serving as the base insulating film in Sample A was subjected to CMP treatment, so that Sample G in which the surface roughness of the base insulating film was reduced was formed. XRD measurement was performed on Sample G in a manner similar to that of Sample A to Sample F. Here, CMP treatment was performed on Sample G so that the base insulating film was reduced to a thickness of 270 nm, under conditions where the treatment temperature was room temperature, the polishing pressure was 0.08 MPa, the spindle rotational speed was 50 rpm, and the table rotational speed was 50 rpm. Note that Sample G was formed under the same conditions as Sample A, except for the CMP treatment.

Figure 13:
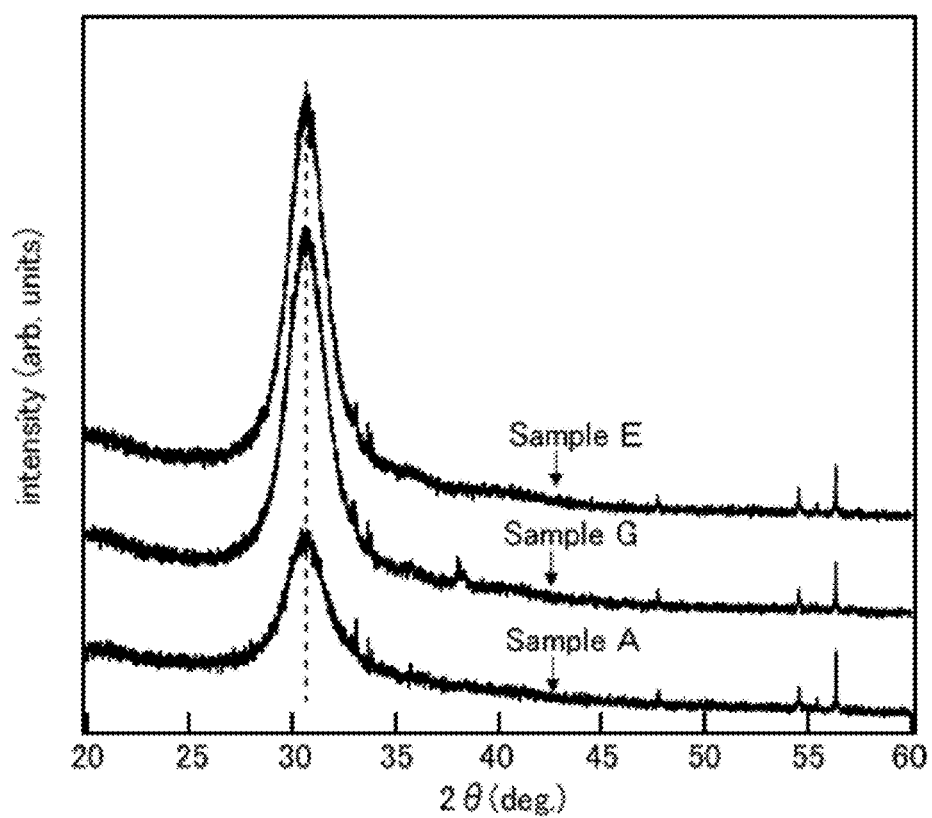
FIG. 13 shows XRD spectra according to one example of the present invention.

FIG. 13 shows results of measurement of XRD spectra of Sample A, Sample E, and Sample G by an out-of-plane method. In FIG. 13, as in FIG. 12, the vertical axis represents the X-ray diffraction intensity (arbitrary unit), and the horizontal axis represents the rotation angle 2θ [deg.].

According to FIG. 13, the intensity of a peak in the vicinity of 2θ=31° of Sample G is far higher than that of Sample A and is substantially equal to that of Sample E. That is, it is found that the crystallinity of the oxide semiconductor film of Sample G is at substantially the same level as the crystallinity of the oxide semiconductor film of Sample E. Accordingly, in the sample in which the silicon oxide film was used as the base insulating film, by performing the CMP treatment on the silicon oxide film to improve the planarity, the crystallinity of the oxide semiconductor film can be improved to substantially the same level as that of the sample in which the thermal oxide film was used as the base insulating film.

The surface roughness of the silicon oxide film of Sample G was measured with the use of an AFM in a manner similar to the above; the average surface roughness of the silicon oxide film of Sample G was 0.2 nm as in the case of the thermal oxide film of Sample E. This means that the base insulating films of Sample G and Sample E have substantially the same level of average surface roughness. Since Sample G and Sample E have substantially the same level of peak intensity of XRD spectrum, the oxide semiconductor films thereof also have substantially the same level of crystallinity. Accordingly, it is found that the crystallinity of an oxide semiconductor film increases as the average surface roughness of a base insulating film gets smaller.

Figure 14A:
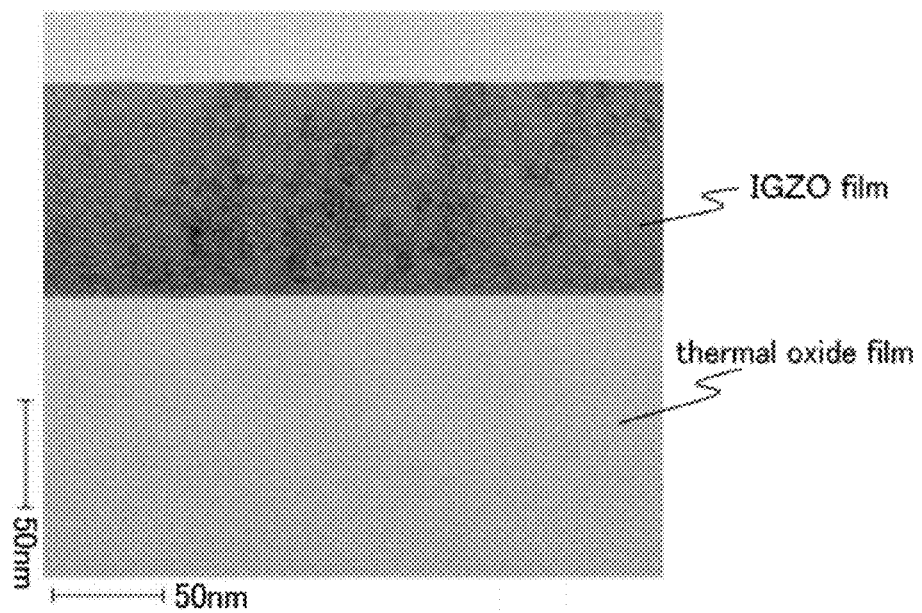
FIGS. 14A and 14B are cross-sectional TEM images according to one example of the present invention.
Figure 14B:
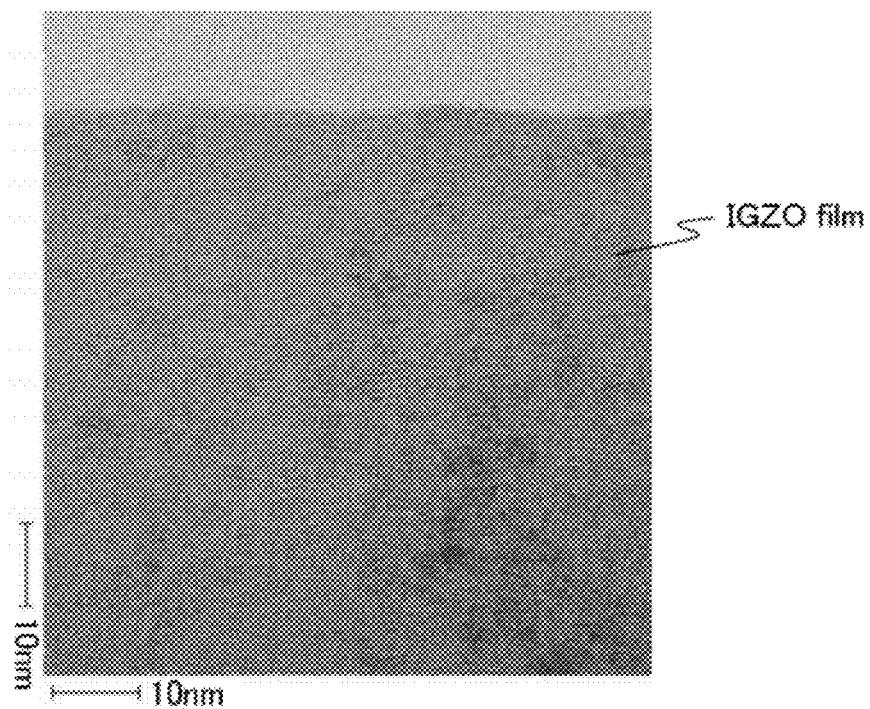

Here, a cross-sectional TEM image of Sample E is shown in FIG. 14A, and an enlarged cross-sectional TEM image of a surface of the oxide semiconductor film of Sample E is shown in FIG. 14B. A cross-sectional TEM image of Sample A is shown in FIG. 15A, and an enlarged cross-sectional TEM image of a surface of the oxide semiconductor film of Sample A is shown in FIG. 15B.

As shown in FIGS. 14A and 14B, the oxide semiconductor film of Sample E is provided over and in contact with the sufficiently planar thermal oxide film, and crystals whose c-axes are aligned in a direction substantially perpendicular to a surface of the thermal oxide film are arranged in layers. As shown in FIG. 14B, the surface of the oxide semiconductor film of Sample E has sufficient planarity.

Figure 15A:
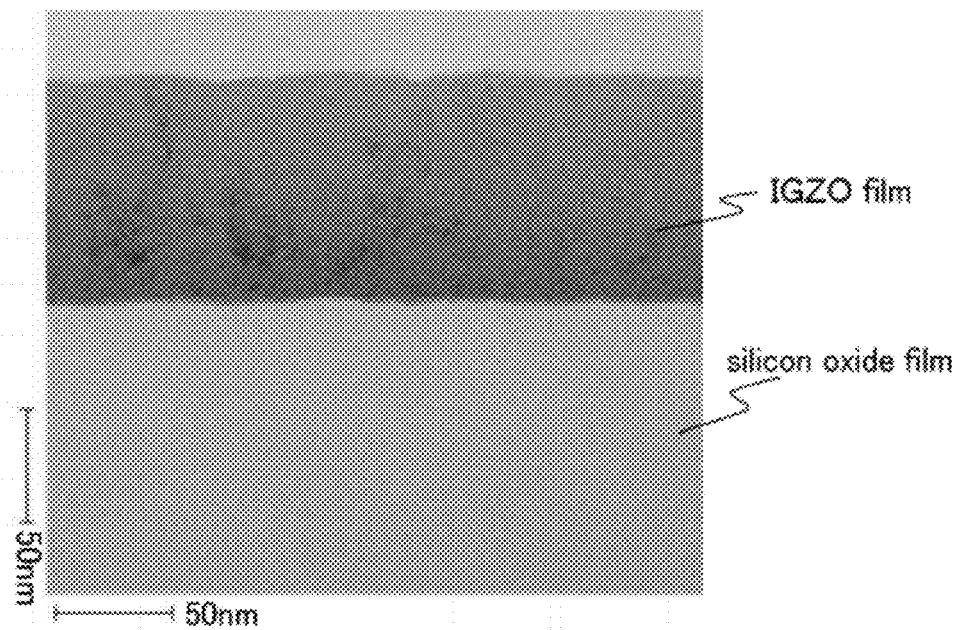
FIGS. 15A and 15B are cross-sectional TEM images according to one example of the present invention.
Figure 15B:
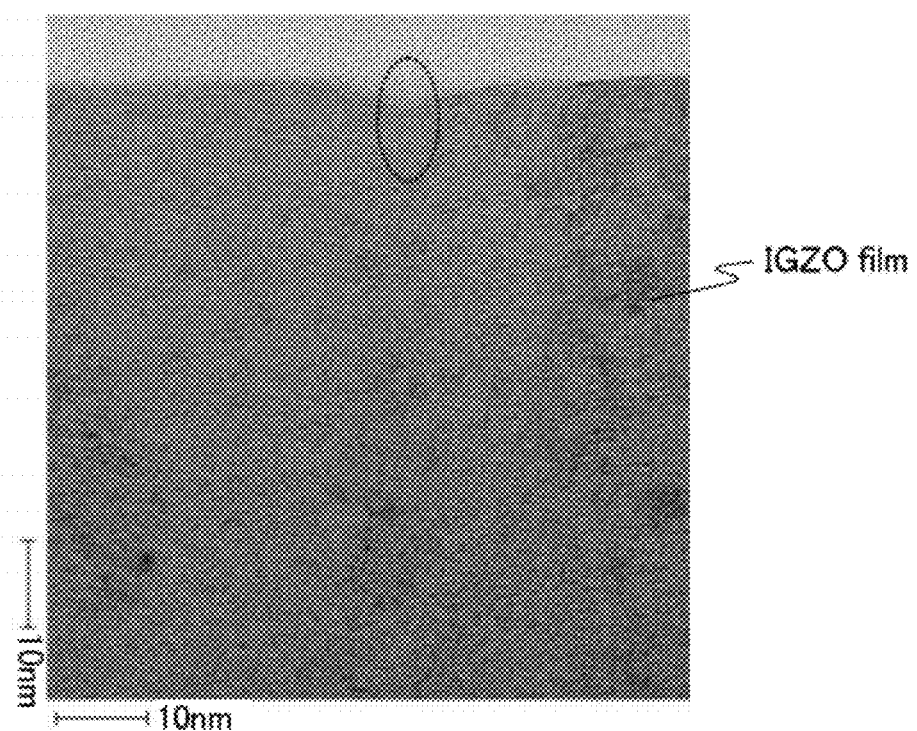

In contrast, as shown in FIGS. 15A and 15B, the oxide semiconductor film of Sample A is provided over and in contact with the silicon oxide film with insufficient planarity, and crystals whose c-axes are aligned in a direction substantially perpendicular to a surface of the silicon oxide film are arranged in layers. However, a portion like a region that is surrounded by a dashed line in FIG. 15B is observed, in which layers of crystals growing in different directions interfere with each other, so that the layers of crystals are separated from each other and a grain boundary is formed. As shown in FIG. 15B, the surface of the oxide semiconductor film of Sample A does not have sufficient planarity, owing to an influence of projections of the surface of the silicon oxide film.

Thus, the cross-sectional TEM images also indicate that the crystallinity of an oxide semiconductor film increases as the average surface roughness of a base insulating film gets smaller.

Figure 16:
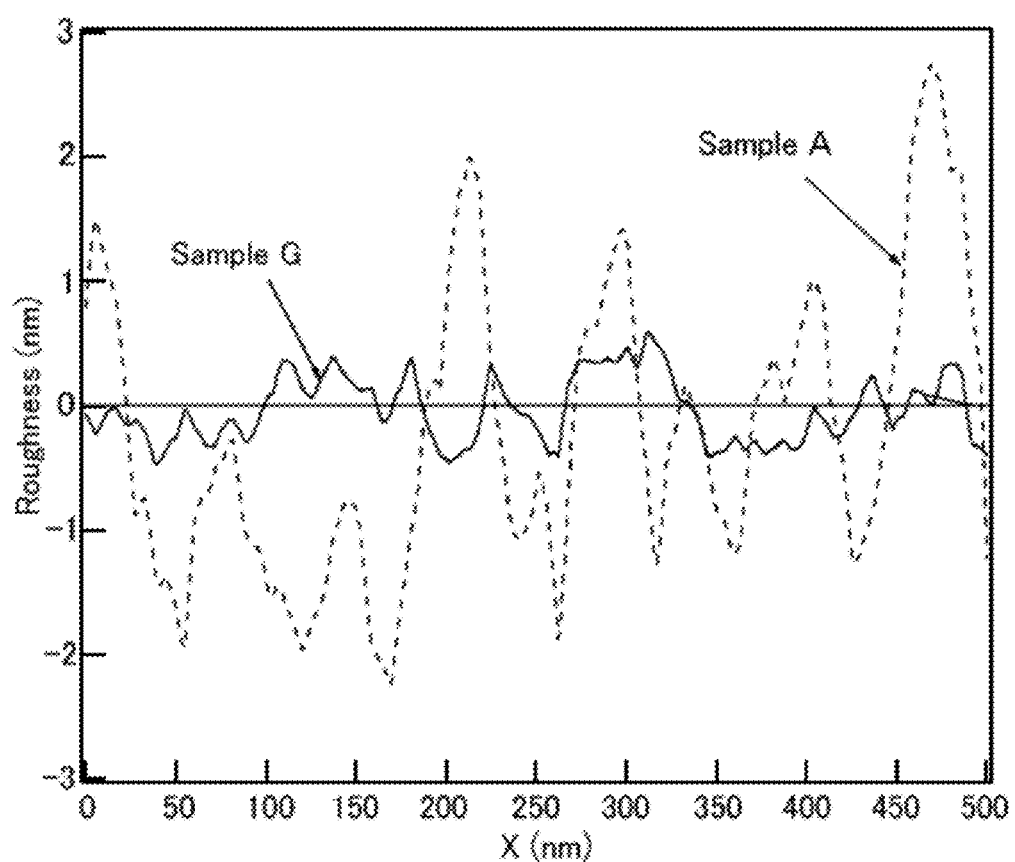
FIG. 16 shows data of AFM measurement according to one example of the present invention.

FIG. 16 shows roughness curves of the base insulating film of Sample A and the base insulating film of Sample G; the roughness curves were obtained from AFM images of the samples with the measurement length L set to 500 nm. In FIG. 16, the vertical axis represents the surface roughness [nm] and the horizontal axis represents the measurement length [nm].

It is obvious from FIG. 16 that the surface roughness of the base insulating film of Sample G is smaller than that of the base insulating film of Sample A. As for the difference d in height from a top of a projection to a bottom of a valley between the projection and a projection adjacent thereto, which is shown in FIG. 2C, the base insulating film of Sample A has a large number of portions where the difference d is greater than or equal to 1 nm, while the base insulating film of Sample G has few portions where the difference d is greater than or equal to 1 nm and has a large number of portions where the difference d is less than or equal to 0.3 nm. In addition, the center line average roughnesses of Sample A and Sample G were 1.0 nm and 0.23 nm, respectively, which were obtained by calculation using the roughness curves of the base insulating films of Sample A and Sample G in FIG. 16. As described above, the average surface roughness of the base insulating film of Sample A was 0.9 nm, and the average surface roughness of the base insulating film of Sample G was 0.2 nm. These results indicate that the surface roughness of the silicon oxide film used for Sample G is certainly reduced by CMP treatment.

The above results indicate that the crystallinity of an oxide semiconductor film increases as the average surface roughness of a base insulating film gets smaller. Here, Sample A, Sample C, Sample E, and Sample G in FIG. 12 and FIG. 13, in which the oxide semiconductor films were formed using only an oxygen gas, are compared. The intensities of the peaks in the vicinity of 2θ=31° of Sample E and Sample G whose base insulating films each have an average surface roughness of 0.2 nm are approximately two or more times as high as those of Sample A whose base insulating film has an average surface roughness of 0.9 nm and Sample C whose base insulating film has an average surface roughness of 0.5 nm, and the crystallinity of the oxide semiconductor films of Sample E and Sample G is significantly higher. Therefore, the average surface roughness of the base insulating film is preferably greater than or equal to 0.1 nm and less than 0.5 nm.

It is indicated that such a reduction in the surface roughness of a base insulating film leads to an increase in the crystallinity of an oxide semiconductor film provided over and in contact with the base insulating film. By using such an oxide semiconductor film having high crystallinity for a semiconductor device, a highly reliable semiconductor device having stable electric characteristics can be provided. Moreover, by using the oxide semiconductor film, a semiconductor device having higher mobility can be provided.

This application is based on Japanese Patent Application serial no. 2011-067866 filed with the Japan Patent Office on Mar. 25, 2011, the entire contents of which are hereby incorporated by reference.

What is claimed is:

1. A semiconductor device comprising:
an insulating film; and
an oxide semiconductor film over and in contact with the insulating film,
wherein the insulating film comprises a surface whose average surface roughness is less than 0.5 nm, and
wherein the oxide semiconductor film comprises a crystal whose c-axis is substantially perpendicular to the surface of the insulating film.

2. The semiconductor device according to claim 1, wherein the insulating film comprises oxygen.

3. The semiconductor device according to claim 1, wherein the insulating film is a silicon oxide film or a silicon oxynitride film.

4. The semiconductor device according to claim 1, wherein the insulating film is a silicon oxide film formed by thermally oxidizing a surface of a silicon substrate.

5. The semiconductor device according to claim 1, wherein the surface of the insulating film is formed through a CMP treatment.

6. The semiconductor device according to claim 1, wherein the semiconductor device is incorporated in one selected from the group consisting of a computer, a portable information terminal, a mobile phone, a camera and a television device.

7. A semiconductor device comprising:
   a first insulating film;
   an oxide semiconductor film over and in contact with the first insulating film;
   a source electrode and a drain electrode that are in contact with the oxide semiconductor film;
   a second insulating film over the oxide semiconductor film; and
   a gate electrode over the second insulating film,
   wherein the first insulating film comprises a surface whose average surface roughness is less than 0.5 nm, and
   wherein the oxide semiconductor film comprises a crystal whose c-axis is substantially perpendicular to the surface of the first insulating film.

8. The semiconductor device according to claim 7, wherein the first insulating film comprises oxygen.

9. The semiconductor device according to claim 7, wherein the first insulating film is a silicon oxide film or a silicon oxynitride film.

10. The semiconductor device according to claim 7, wherein the first insulating film is a silicon oxide film formed by thermally oxidizing a surface of a silicon substrate.

11. The semiconductor device according to claim 7, wherein the surface of the first insulating film is formed through a CMP treatment.

12. The semiconductor device according to claim 7, wherein the semiconductor device is incorporated in one selected from the group consisting of a computer, a portable information terminal, a mobile phone, a camera and a television device.

13. A method of manufacturing a semiconductor device, comprising the steps of:
   forming an insulating film comprising a surface with an average surface roughness of less than 0.5 nm; and
   forming an oxide semiconductor film over the insulating film while heating, so that a crystal whose c-axis is substantially perpendicular to the surface of the insulating film is formed in the oxide semiconductor film.

14. The method of manufacturing a semiconductor device according to claim 13, wherein the insulating film comprises oxygen.

15. The method of manufacturing a semiconductor device according to claim 13, wherein the insulating film is a silicon oxide film or a silicon oxynitride film.

16. The method of manufacturing a semiconductor device according to claim 13, wherein the insulating film is a silicon oxide film formed by thermally oxidizing a surface of a silicon substrate.

17. The method of manufacturing a semiconductor device according to claim 13, wherein the surface of the insulating film is formed through a CMP treatment.

18. The method of manufacturing a semiconductor device according to claim 13, wherein the oxide semiconductor film is formed in an oxygen atmosphere.

19. The method of manufacturing a semiconductor device according to claim 13, further comprising the step of performing heat treatment on the oxide semiconductor film after the oxide semiconductor film is formed.

20. The method of manufacturing a semiconductor device according to claim 13, wherein the semiconductor device is incorporated in one selected from the group consisting of a computer, a portable information terminal, a mobile phone, a camera and a television device.

* * * * *